(12) United States Patent
Mignot et al.

(10) Patent No.: US 12,191,388 B2
(45) Date of Patent: Jan. 7, 2025

(54) AREA SCALING FOR VTFET CONTACTS

(71) Applicant: International Business Machines Corporation, Armonk, NY (US)

(72) Inventors: Yann Mignot, Slingerlands, NY (US); Su Chen Fan, Cohoes, NY (US); Jing Guo, Niskayuna, NY (US); Lijuan Zou, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 164 days.

(21) Appl. No.: 17/520,812

(22) Filed: Nov. 8, 2021

(65) Prior Publication Data

US 2023/0145135 A1     May 11, 2023

(51) Int. Cl.
    *H01L 29/66*     (2006.01)
    *H01L 21/8234*     (2006.01)
    *H01L 29/08*     (2006.01)
    *H01L 29/78*     (2006.01)

(52) U.S. Cl.
    CPC ...... *H01L 29/7827* (2013.01); *H01L 29/0847* (2013.01); *H01L 29/6656* (2013.01); *H01L 29/66666* (2013.01); *H01L 29/7851* (2013.01)

(58) Field of Classification Search
    CPC ......... H01L 21/02063; H01L 21/76802; H01L 21/76804; H01L 21/76831; H01L 21/766843; H01L 21/76897; H01L 21/823487; H01L 21/823885; H01L 23/5226; H01L 29/0676; H01L 29/1037; H01L 29/66666; H01L 29/7827; H01L 29/78642; H01L 29/7788
See application file for complete search history.

(56) References Cited

U.S. PATENT DOCUMENTS

| | | | |
|---|---|---|---|
| 6,583,053 B2 | 6/2003 | Lu et al. |
| 9,396,995 B1 | 7/2016 | Patil et al. |
| 9,627,511 B1 | 4/2017 | Cheng et al. |
| 9,666,476 B2 | 5/2017 | Hu et al. |
| 9,691,659 B1 | 6/2017 | Mignot et al. |
| 10,622,301 B2 | 4/2020 | Xu et al. |

(Continued)

*Primary Examiner* — David C Spalla
(74) *Attorney, Agent, or Firm* — Samuel A. Waldbaum

(57) ABSTRACT

Techniques for area scaling of contacts in VTFET devices are provided. In one aspect, a VTFET device includes: a fin(s); a bottom source/drain region at a base of the fin(s); a gate stack alongside the fin(s); a top source/drain region present at a top of the fin(s); a bottom source/drain contact to the bottom source/drain region; and a gate contact to the gate stack, wherein the bottom source drain and gate contacts each includes a top portion having a width $W1_{CONTACT}$ over a bottom portion having a width $W2_{CONTACT}$, wherein $W2_{CONTACT} < W1_{CONTACT}$, and wherein a sidewall along the top portion is discontinuous with a sidewall along the bottom portion. The bottom portion having the width $W2_{CONTACT}$ is present alongside the gate stack and the top source/drain region. A method of forming a VTFET device is also provided.

20 Claims, 14 Drawing Sheets

(56) References Cited

U.S. PATENT DOCUMENTS

| | | | |
|---|---|---|---|
| 2004/0018714 A1* | 1/2004 | Cooney, III | H01L 21/76844 |
| | | | 438/618 |
| 2006/0261406 A1 | 11/2006 | Chen | |
| 2015/0001735 A1 | 1/2015 | Mignot et al. | |
| 2018/0061700 A1 | 3/2018 | Sun et al. | |
| 2018/0138091 A1 | 5/2018 | Mallela et al. | |
| 2019/0172927 A1 | 6/2019 | Jagannathan et al. | |
| 2019/0378926 A1* | 12/2019 | Song | H01L 29/41741 |
| 2020/0295134 A1* | 9/2020 | Do | H01L 29/41741 |
| 2020/0365603 A1* | 11/2020 | Moriwaki | H10B 10/12 |

* cited by examiner

AREA SCALING FOR VTFET CONTACTS

FIELD OF THE INVENTION

The present invention relates to vertical transport field-effect transistor (VTFET) devices, and more particularly, to techniques for area scaling of contacts in VTFET devices.

BACKGROUND OF THE INVENTION

As opposed to planar complementary metal-oxide-semiconductor (CMOS) devices, vertical transport field effect transistor (VTFET) devices are oriented with vertical fin channels disposed on a bottom source/drain region and a top source/drain region disposed on the vertical fin channels. VTFET devices are being pursued as a viable device option for continued CMOS scaling.

There are, however, notable challenges associated with implementing a VTFET device design. For instance, as device dimensions get increasingly smaller, contact fabrication using conventional process flows becomes very challenging. Namely, conventional lithography and etching approaches place contacts to the bottom source/drain region very close to the gate alongside the vertical fin channel, thereby creating a significant risk of shorting between the bottom source/drain contact and the gate. Similarly, conventional approaches tend to place the contacts to the gate very close to top source/drain region at the top of the vertical fin channel, thereby creating a significant risk of shorting between the gate contact and the top source/drain region. Further, when at a tight pitch, a short can likewise be created between the gates of adjacent devices.

Therefore, improved techniques for contact formation in VTFET devices that are scalable would be desirable.

SUMMARY OF THE INVENTION

The present invention provides techniques for area scaling of contacts in vertical transport field-effect transistor (VTFET) devices. In one aspect of the invention, a VTFET device is provided. The VTFET device includes: at least one fin serving as a vertical fin channel; a bottom source/drain region present at a base of the at least one fin; a gate stack alongside the at least one fin; a top source/drain region present at a top of the at least one fin; a bottom source/drain contact to the bottom source/drain region; and a gate contact to the gate stack, wherein the bottom source drain contact and the gate contact each includes a top portion having a width $W1_{CONTACT}$ over a bottom portion having a width $W2_{CONTACT}$, wherein $W2_{CONTACT} < W1_{CONTACT}$, and wherein a sidewall along the top portion is discontinuous with a sidewall along the bottom portion.

In another aspect of the invention, another VTFET device is provided. The VTFET device includes: at least one fin serving as a vertical fin channel of the VTEFT device; a bottom source/drain region present at a base of the at least one fin; a gate stack alongside the at least one fin; a top source/drain region present at a top of the at least one fin; a bottom source/drain contact to the bottom source/drain region; and a gate contact to the gate stack, wherein the bottom source drain contact and the gate contact each includes a top portion having a width $W1_{CONTACT}$ over a bottom portion having a width $W2_{CONTACT}$, wherein $W2_{CONTACT} < W1_{CONTACT}$, and wherein the bottom portion having the width $W2_{CONTACT}$ is present alongside the gate stack and the top source/drain region.

In yet another aspect of the invention, a method of forming a VTFET device is provided. The method includes: forming a VTFET including: at least one fin serving as a vertical fin channel, a bottom source/drain region present at a base of the at least one fin, a gate stack alongside the at least one fin, and a top source/drain region present at a top of the at least one fin; depositing a first ILD over the VTFET; depositing a capping layer on the first ILD; depositing a second ILD on the capping layer; forming contact trenches in the second ILD, wherein the contact trenches include at least a first contact trench over the bottom source/drain region and a second contact trench over the gate stack; forming sidewall spacers along sidewalls of the contact trenches; performing an etch between the sidewall spacers to extend the contact trenches through the capping layer and the first ILD; removing the sidewall spacers such that each of the contact trenches includes a top portion having a width $W1_{TRENCH}$ over a bottom portion having a width $W2_{TRENCH}$, wherein $W2_{TRENCH} < W1_{TRENCH}$, and wherein a sidewall along the top portion is discontinuous with a sidewall along the bottom portion; and filling the contact trenches with at least one contact metal.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for area scaling of bottom contacts in vertical transport field-effect transistor (VTFET) devices. As will be described in detail below, the present techniques leverage use of a metal liner to shrink the width of the trenches in which the bottom contacts are formed in order to help preserve the dielectric that separates the gate from the top and bottom source/drain regions and which separates the gates of adjacent devices in order to avoid any risk of shorting between the bottom source/drain region contact and the gate, between the gate and the top source/drain region and/or between the gates of adjacent devices even at scaled dimensions. Notably, as will be described in detail below, the contacts produced in accordance with the present techniques will have a unique structure, such as a discontinuous sidewall with a wide top and a narrow bottom.

Figure 1:
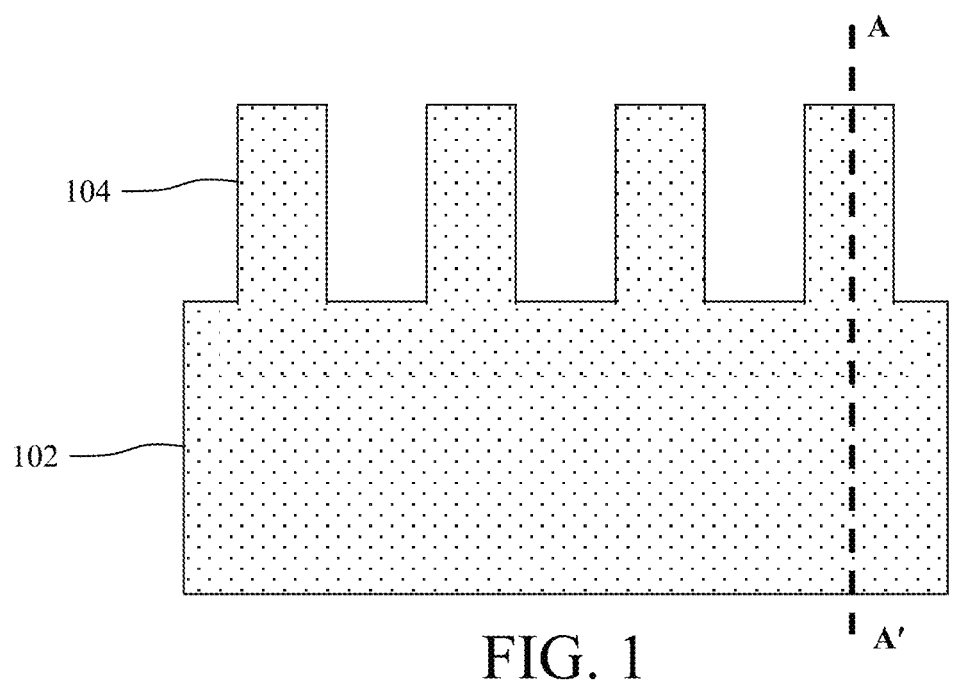
FIG. 1 is a cross-sectional diagram illustrating a fin(s) having been patterned in a substrate according to an embodiment of the present invention.
Figure 2:
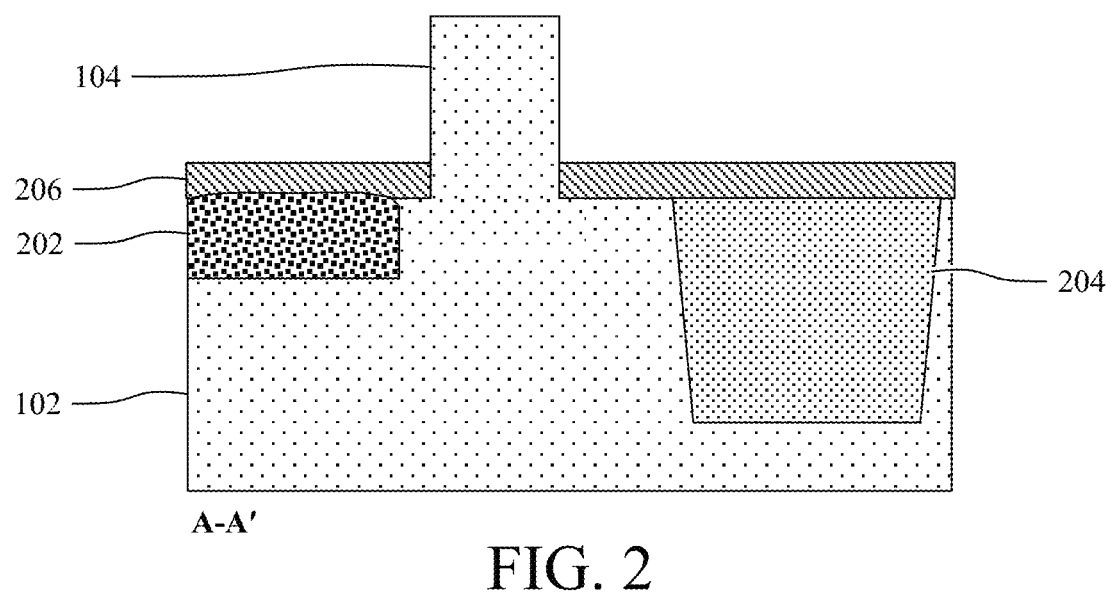
FIG. 2 is an A-A' cross-sectional view illustrating a bottom source/drain region having been formed in the substrate at a base of the fins(s), a shallow trench isolation (STI) region having been formed in the substrate on a side of the fin(s) opposite the bottom source/drain region, and a bottom spacer having been formed on the substrate over the bottom source/drain region and STI region according to an embodiment of the present invention.

An exemplary methodology for forming a VTFET device in accordance with the present techniques is now described by way of reference to FIGS. 1-15. As shown in FIG. 1, the process begins with the patterning of at least one fin 104 in a substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

Standard lithography and etching techniques can be employed to pattern the fin(s) 104 in substrate 102. With standard lithography and etching techniques, a lithographic stack (not shown), e.g., photoresist/anti-reflective coating (ARC)/organic planarizing layer (OPL), is used to pattern a fin hardmask (not shown) with the footprint and location of the features to be patterned (in this case the fin(s) 102). Alternatively, the fin hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the fin hardmask to the underlying substrate 102 to form the fin(s) 104. A directional (anisotropic) etching process such as reactive ion etching (RIE) can be employed for the fin etch. As shown in FIG. 1, subsequent figures will depict views of an A-A' cross-sectional cut through one of the fins 104.

A bottom source/drain region 202 is then formed in the substrate 102 at a base of the fins(s) 104, a shallow trench isolation (STI) region 204 is formed in the substrate 102 on a side of the fin(s) 104 opposite bottom source/drain region 202, and a bottom spacer 206 is formed on the substrate 102 over the bottom source/drain region 202 and STI region 204. See FIG. 2 (an A-A' cross-sectional view).

According to an exemplary embodiment, bottom source/drain region 202 is formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

To form STI region 204, standard lithography and etching techniques (see above) can be employed to first pattern a trench in the substrate 102, which is then filled with a dielectric material to form STI region 204. Suitable STI dielectric materials include, but are not limited to, oxide materials such as silicon oxide (SiOx) which can be deposited using a process such as chemical vapor deposition (CVD), atomic layer deposition (ALD) or physical vapor deposition (PVD). STI region 204 will serve to isolate individual VTFET devices.

Suitable materials for the bottom spacer 206 include, but are not limited to, oxide spacer materials such as SiOx and/or silicon oxycarbide (SiOC) and/or nitride spacer materials such as SiN, silicon-boron-nitride (SiBN), siliconborocarbonitride (SiBCN) and/or silicon oxycarbonitride (SiOCN). According to an exemplary embodiment, the bottom spacers 206 is formed using a directional deposition process whereby a greater amount of the spacer material is deposited on horizontal surfaces (including on top of the substrate 102, bottom source/drain region 202 and STI region 204) as compared to vertical surfaces (such as along sidewalls of the fin(s) 104). Thus, when an etch is used on the spacer material, the timing of the etch needed to remove the spacer material from the vertical surfaces will leave the bottom spacer 206 shown in FIG. 2 on the substrate 102, bottom source/drain region 202 and STI region 204 since a greater amount of the spacer material was deposited on these surfaces to begin with. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. According to an exemplary embodiment, the bottom spacer 206 has a thickness of from about 5 nanometers (nm) to about 20 nm and ranges therebetween.

A gate stack 300 is formed alongside the fin(s) 104, an encapsulation layer 308 is disposed over the gate stack 300 and bottom spacer 206, and a top source/drain region 310 is formed at the top of the fin(s) 104. See FIG. 3 (an A-A' cross-sectional view). As shown in magnified view 302, the gate stack 300 includes a gate dielectric 304 and a gate conductor 306. Although not explicitly shown in the figures, an interfacial oxide may first be formed on the exposed surfaces of the fin(s) 104 prior to depositing the gate dielectric 304 such that the gate dielectric 304 is disposed on the fin(s) 104 over the interfacial oxide. By way of example only, the interfacial oxide can be formed on the exposed surfaces of the fin(s) 104 by a thermal oxidation, a chemical oxidation, or any other suitable oxide formation process. According to an exemplary embodiment, the interfacial oxide has a thickness of from about 0.5 nm to about 5 nm and ranges therebetween, e.g., about 1 nm.

Suitable materials for the gate dielectric 304 include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as $HfO_2$, hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc, Ta)O_3$) and/or lead zinc niobite (Pb(Zn,Nb)O). The high-κ material can further include dopants such as lanthanum (La), aluminum (Al) and/or magnesium (Mg). The gate dielectric 304 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 304 has a thickness of from about 1 nm to about 5 nm and ranges therebetween.

Figure 3:
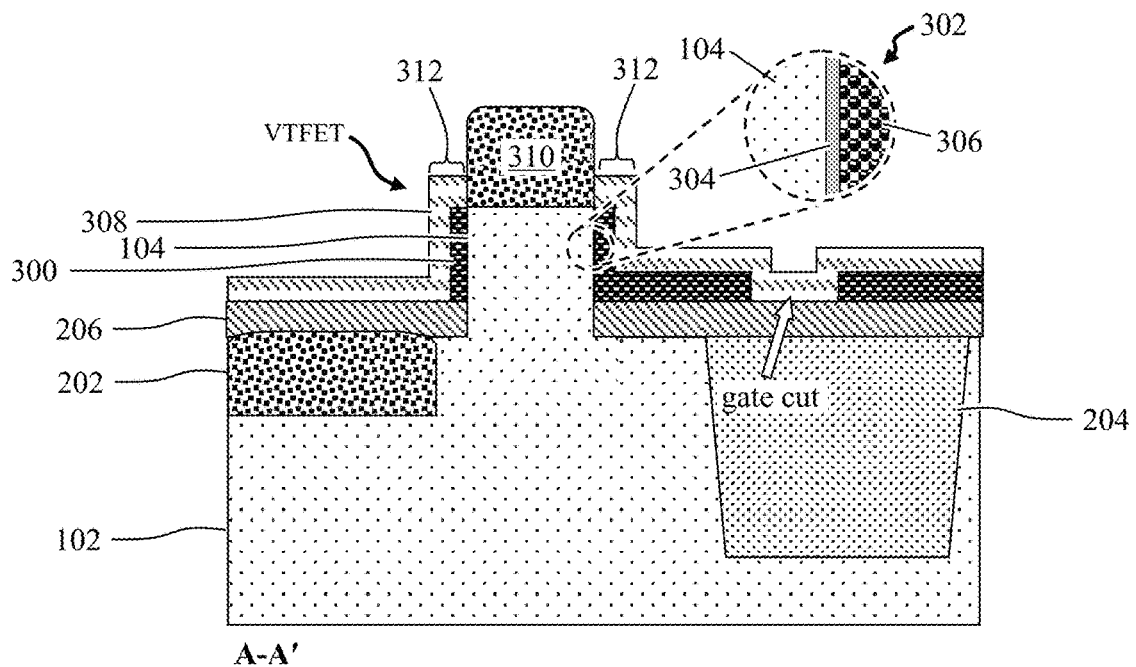
FIG. 3 is an A-A' cross-sectional view illustrating a gate stack having been formed alongside the fin(s), an encapsulation layer having been disposed over the gate stack and the bottom spacer, and a top source/drain region having been formed at the top of the fin(s) according to an embodiment of the present invention.
Figure 4:
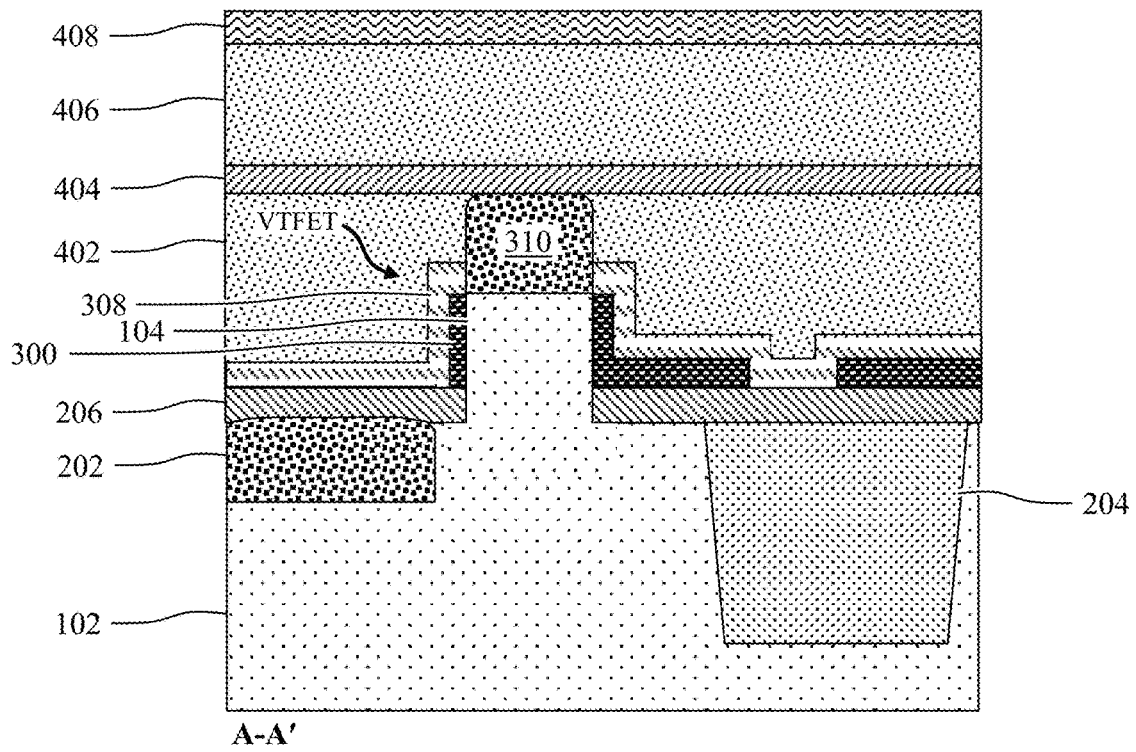
FIG. 4 is an A-A' cross-sectional view illustrating a first interlayer dielectric (ILD) having been deposited onto the substrate over the fins(s), bottom source/drain region, bottom spacer, gate stack, encapsulation layer, and top source/drain region, a capping layer having been deposited onto the first ILD, a second ILD having been deposited onto the capping layer, and a hardmask layer having been deposited onto the second ILD according to an embodiment of the present invention.
Figure 5:
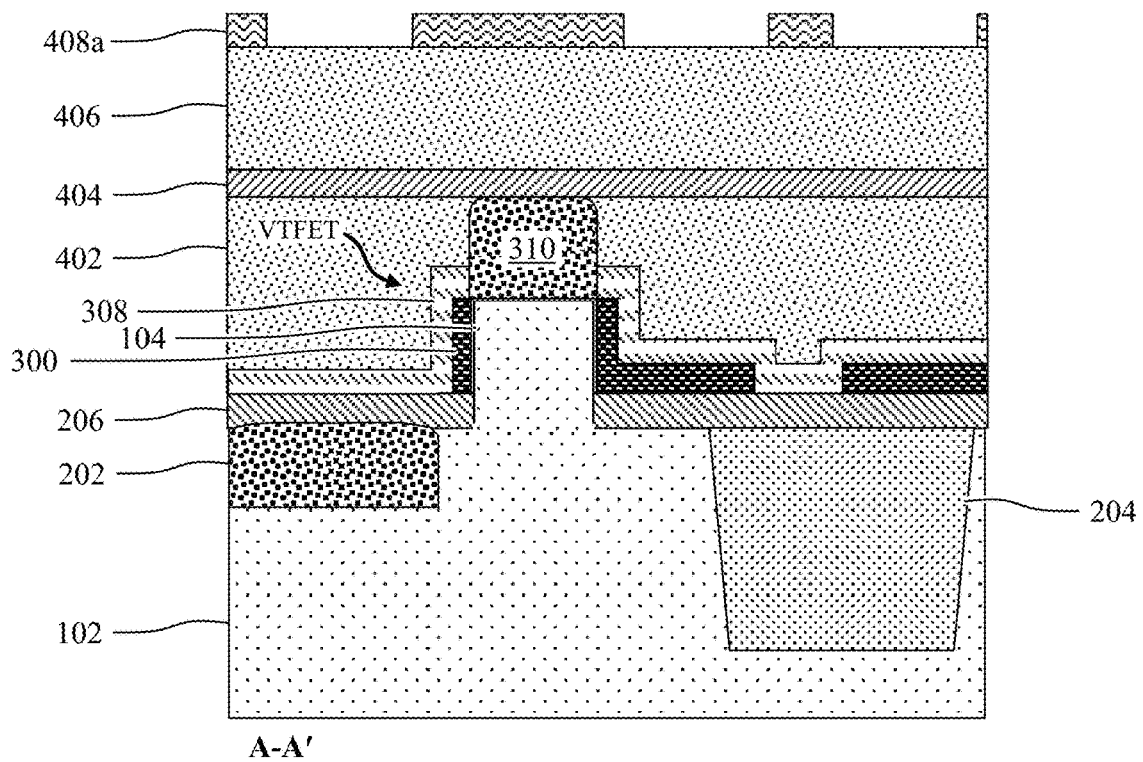
FIG. 5 is an A-A' cross-sectional view illustrating the hardmask layer having been patterned with the footprint and location of one or more contact trenches according to an embodiment of the present invention.
Figure 6:
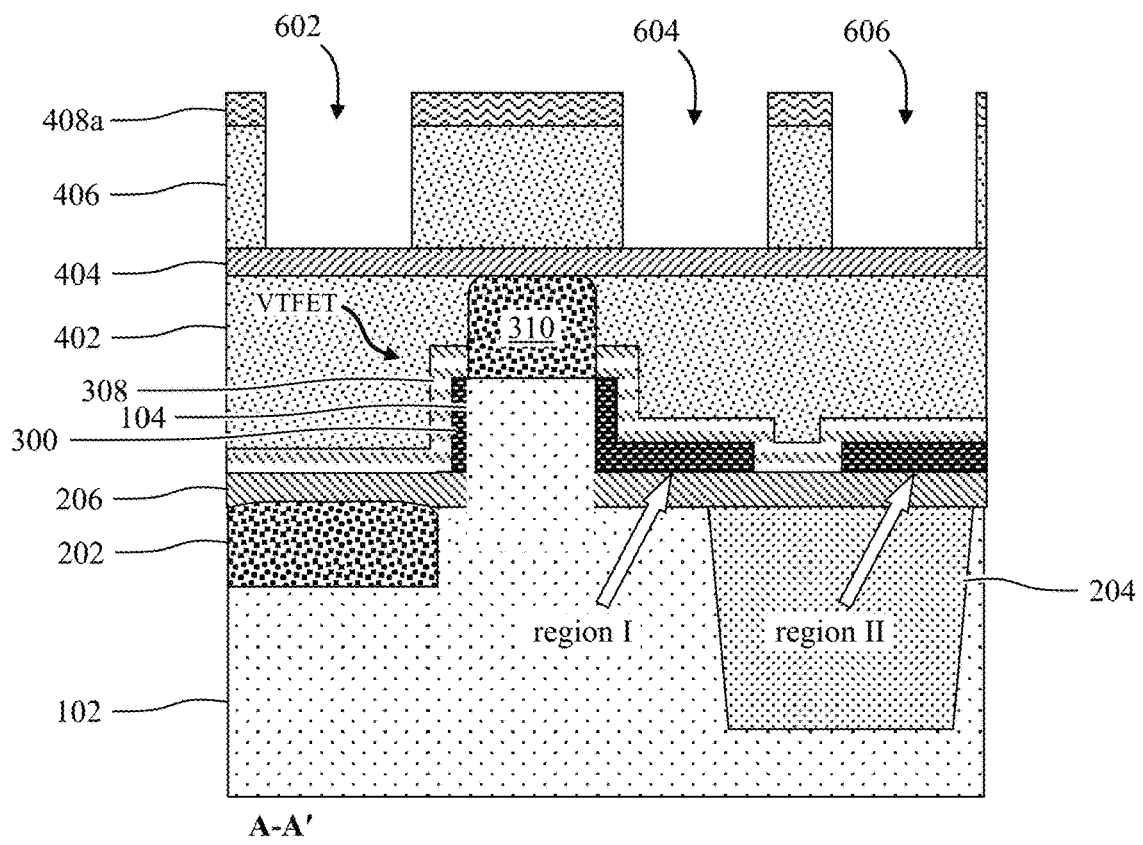
FIG. 6 is an A-A' cross-sectional view illustrating the pattern from the hardmask layer having been transferred to the second ILD to form (first/second) contact trenches in the second ILD over the bottom source/drain region and over a first region (region I) and a second region (region II) of the gate stack according to an embodiment of the present invention.

In one exemplary embodiment, the gate conductor 306 includes a workfunction-setting metal or a combination of workfunction-setting metals. Suitable workfunction-setting metals include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC). The workfunction-setting metal(s) can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 306 has a thickness of from about 5 nm to about 10 nm and ranges therebetween. As shown in FIG. 3, following deposition the gate stack 300 is cut in between the fins(s) 104.

Suitable materials for the encapsulation layer 308 include, but are not limited to, nitride materials such as SiN, SiBN, SiBCN and/or SiOCN, which can be deposited using a process such as CVD, ALD or PVD. According to an exemplary embodiment, the encapsulation layer 308 has a thickness of from about 5 nm to about 20 nm and ranges therebetween. As shown in FIG. 3, portions of the encapsulation layer 308 at the top of the fins(s) 104 serve as a top spacer 312. The bottom spacer 206 and top spacer 312 serve to offset the gate stack 300 from the bottom source/drain region 202 and the top source/drain region 310, respectively.

According to an exemplary embodiment, top source/drain region 310 is formed from an in-situ doped or ex-situ doped epitaxial material such as epitaxial Si, epitaxial SiGe, etc. As provided above, suitable n-type dopants include, but are not limited to, P and/or As, and suitable p-type dopants include, but are not limited to, B. The fins(s) 104 in between the bottom source/drain region 202 and the top source/drain region 310 serves as a vertical fin channel.

Thus, at least one VTFET has now been formed. Namely, as shown in FIG. 3, the VTFET includes the bottom source/drain region 202 and the top source/drain region 310 interconnected by the fin(s) 104 (i.e., a vertical fin channel), and the gate stack 300, alongside the vertical fin channel, that is offset from the bottom source/drain region 202 and the top source/drain region 310 by the bottom spacer 206 and the top spacer 312, respectively.

An interlayer dielectric (ILD) 402 is then deposited onto the substrate 102 over the fins(s) 104, bottom source/drain region 202, bottom spacer 206, gate stack 300, encapsulation layer 308, and top source/drain region 310. See FIG. 4 (an A-A' cross-sectional view). Suitable ILD 402 materials include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 402. Following deposition, the ILD 402 can be polished using a process such as chemical-mechanical polishing (CMP).

A capping layer 404 is then deposited onto the ILD 402, an ILD 406 is deposited onto the capping layer 404, and a hardmask layer 408 is deposited onto the ILD 406. Suitable capping layer materials include, but are not limited to, silicon nitride (SiN), silicon oxynitride (SiON) and/or silicon carbide nitride (SiCN) which can be deposited using a process such as CVD, ALD or PVD. According to an exemplary embodiment, the capping layer 404 has a thickness of from about 2 nm to about 10 nm and ranges therebetween. Capping layer 404 will serve as an etch stop during patterning of the ILD 406.

For clarity, the terms 'first' and 'second' may also be used herein when referring to ILD 402 and ILD 406, respectively. Suitable ILD 406 materials include, but are not limited to, oxide materials such as SiOx and/or SiCOH and/or ULK-ILD materials such as pSiCOH. A process such as CVD, ALD, or PVD can be used to deposit the ILD 406. Following deposition, the ILD 406 can be polished using a process such as CMP.

Suitable materials for the hardmask layer 408 include, but are not limited to, a nitride material such as SiN, metal oxides and/or metal nitride materials such as hafnium oxide (HfOx), aluminum oxide (AlOx) and/or aluminum nitride (AlN), which can be deposited using a process such as CVD, ALD or PVD. According to an exemplary embodiment, the hardmask layer 408 has a thickness of from about 2 nm to about 10 nm and ranges therebetween.

Standard lithography and etching techniques (see above) are then used to pattern the hardmask layer 408 with the footprint and location of one or more contact trenches. See FIG. 5 (an A-A' cross-sectional view). A directional (i.e., anisotropic) etching process such as RIE can be employed for the hardmask etch. As-patterned, the hardmask layer is now given the reference numeral 408a.

The pattern from the (patterned) hardmask layer 408a is then transferred to the ILD 406, forming contact trenches 602, 604 and 606 in the ILD 406 over the bottom source/drain region 202 and over a first region (region I) and a second region (region II) of the gate stack 300. See FIG. 6 (an A-A' cross-sectional view). For clarity, the terms 'first' and 'second' may also be used herein when referring to contact trenches 602 and 604/606, respectively. As will be described in detail below, for illustrative purposes only, gate contacts will be formed to the gate stack 300 on both sides of the gate cut. In the present example, it is assumed that region II of the gate stack 300 is associated with an adjacent VTFET device (not shown). A directional (i.e., anisotropic) etching process such as RIE can be employed for the contact trench etch, with the capping layer 404 serving as an etch stop. To look at it another way, at this point in the process the contact trenches 602, 604 and 606 have only been partially formed. Later, the contact trenches 602, 604 and 606 will be extended down through the ILD 402. However, before that is done, a metal liner is used to reduce the critical dimension (CD) of the contact trenches 602, 604 and 606, thereby reducing the risk of shorting between adjacent contacts.

Figure 7:
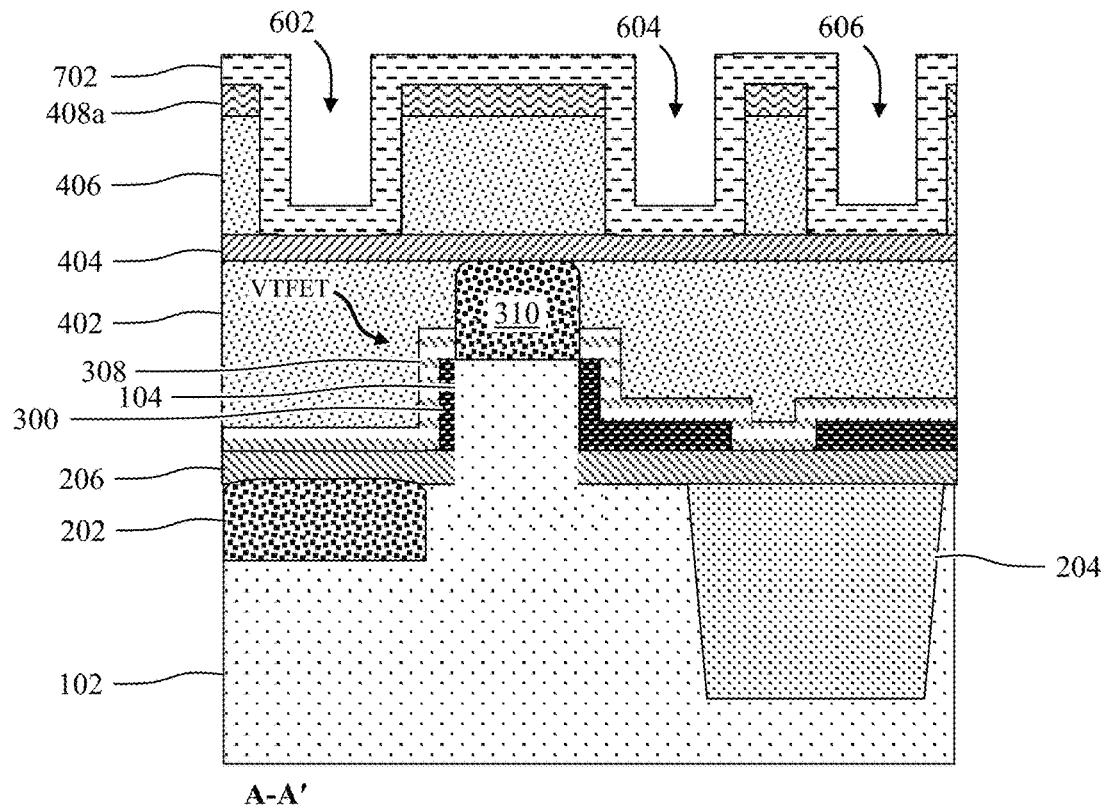
FIG. 7 is an A-A' cross-sectional view illustrating a conformal metal liner having been deposited into, and lining, the first/second contact trenches according to an embodiment of the present invention.

Namely, a conformal metal liner 702 is next deposited onto the (patterned) hardmask layer 408a and into, and lining, the contact trenches 602, 604 and 606. See FIG. 7 (an A-A' cross-sectional view). Suitable metal liner materials include, but are not limited to ruthenium (Ru), cobalt (Co), titanium (Ti) and/or aluminum (Al), which can be deposited using a process such as CVD, ALD, PVD, sputtering, plating, evaporation, ion beam deposition, electron beam deposition, laser assisted deposition, chemical solution deposition, etc. According to an exemplary embodiment, the conformal metal liner 702 has a thickness of from about 5 nm to about 15 nm and ranges therebetween. As shown in FIG. 7, as deposited, the conformal metal liner 702 is present along the sidewalls and at the bottom of each of the contact trenches 602, 604 and 606, where the conformal metal liner 702 is in direct contact with the capping layer 404.

Figure 8:
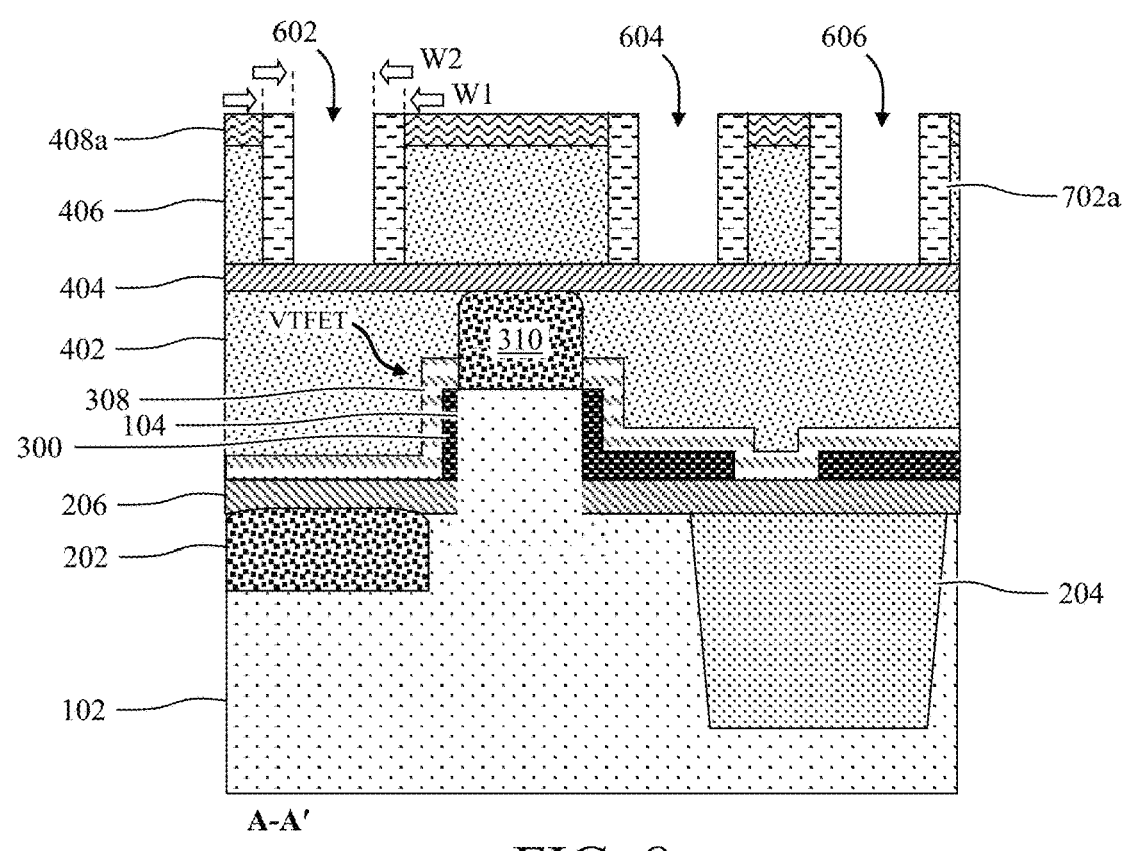
FIG. 8 is an A-A' cross-sectional view illustrating an etch having been used to remove the metal liner from horizontal surfaces including at the bottom of the first/second contact trenches to form sidewall spacers along the sidewalls of the first/second contact trenches according to an embodiment of the present invention.

However, in order to extend the contact trenches 602, 604 and 606 as highlighted above, the metal liner 702 needs to be opened at the bottoms of the contact trenches 602, 604 and 606. See FIG. 8 (an A-A' cross-sectional view). Namely, as shown in FIG. 8, an etch has been employed to remove the metal liner 702 from the horizontal surfaces including along the top of the hardmask layer 408a and at the bottom of the contact trenches 602, 604 and 606. By way of example only, a directional (i.e., anisotropic) etch with a chlorine ($Cl_2$)/boron trichloride ($BCl_3$)-based chemistry can be employed to pattern the hardmask layer 408a with little, if any, effect on the capping layer 404. What is left of the metal liner forms sidewall spacers 702a present along the sidewalls of the contact trenches 602, 604 and 606.

As shown in FIG. 8, the sidewall spacers 702a effectively reduce the as-patterned width W1 of the contact trenches 602, 604 and 606 to a smaller width W2, i.e., W2 is less than W1 (W2<W1). As will be described in detail below, this will enable extension of the contact trenches 602, 604 and 606 down to the bottom source/drain region 202, the first region (region I) and the second region (region II) of the gate stack 300, respectively, with a reduced width and thereby preserving portions of the ILD 402 that will separate the corresponding bottom source/drain and gate contacts that will be formed in the extended contact trenches from the gate stack 300, top source/drain region 310, and the gate contacts of adjacent VTFET devices.

An etch between the sidewall spacers 702a is then performed to extend the contact trenches 602, 604 and 606 through the capping layer 404 and ILD 402 down to the encapsulation layer 308. See FIG. 9 (an A-A' cross-sectional view). A directional (i.e., anisotropic) etching process such as RIE can be employed for the contact trench etch through the capping layer 404 and ILD 402. As provided above, the capping layer 404 can be formed from a nitride material (e.g., SiN, SiON and/or SiCN) and the ILD 402 can be formed from an oxide material (e.g., SiOx and/or SiCOH). In that case, a series of RIE steps may be used such as a nitride-selective RIE step to pattern the capping layer 404, followed by an oxide-selective RIE step to pattern the ILD 402. The encapsulation layer 308, which can be formed from a nitride material (e.g., SiN, SiBN, SiBCN and/or SiOCN—see above), will act as an etch stop during patterning of the ILD 402.

Figure 9:
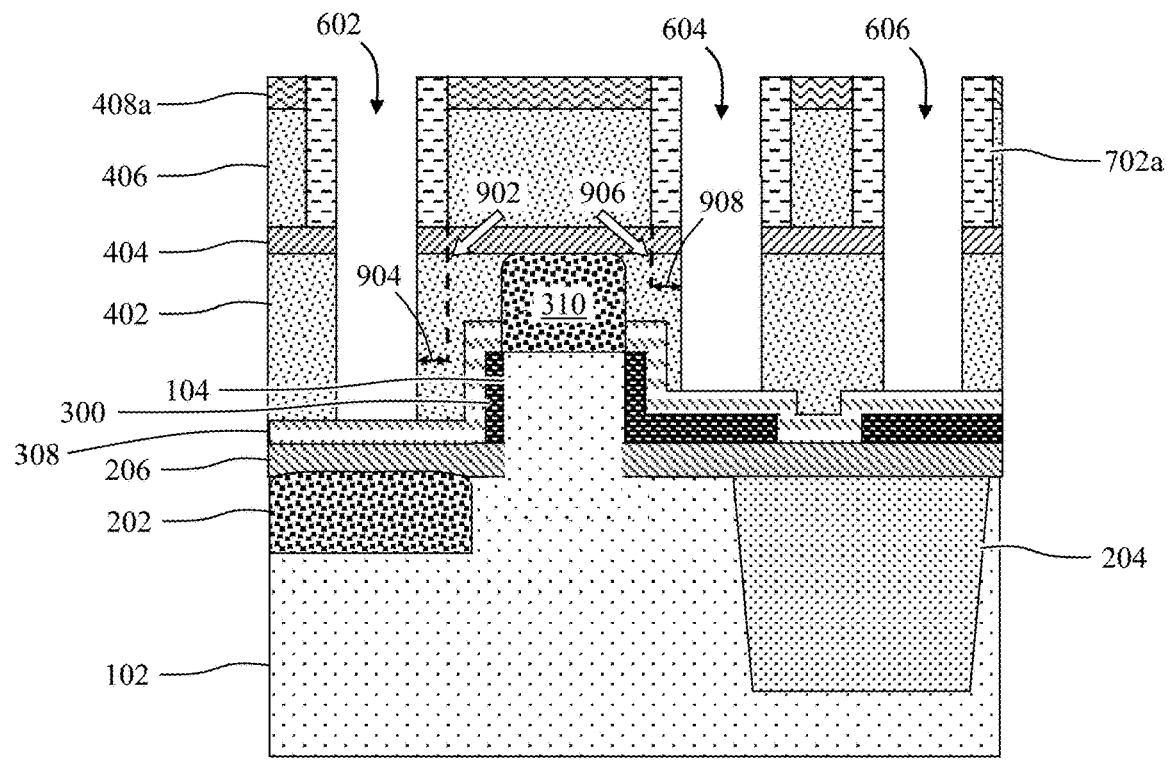
FIG. 9 is an A-A' cross-sectional view illustrating an etch between the sidewall spacers having been performed to extend the first/second contact trenches through the capping layer and first ILD down to the encapsulation layer according to an embodiment of the present invention.

As highlighted above, reducing the width of the contact trenches 602, 604 and 606 for this follow-up etch serves to preserve portions of the ILD 402 in between the contact trenches 602, 604 and 606 and the gate stack 300 and between the contact trenches 602, 604 and 606 and the top source/drain region 310. This feature is illustrated in FIG. 9. Namely, a dashed line 902 is being used to show where the sidewall of the contact trench 602 would be had the sidewall spacers 702a not been placed prior to extending the contact trenches 602, 604 and 606, signifying the preservation of a portion of the ILD 402 in between the contact trench 602 and the gate stacks 300—as indicated by arrow 904. Similarly, a dashed line 906 is being used to show where the sidewall of the contact trench 604 would be had the sidewall spacers 702a not been placed prior to extending the contact trenches 602, 604 and 606, signifying the preservation of a portion of the ILD 402 in between the contact trench 604 and the top source/drain region 310—as indicated by arrow 908.

Figure 10:
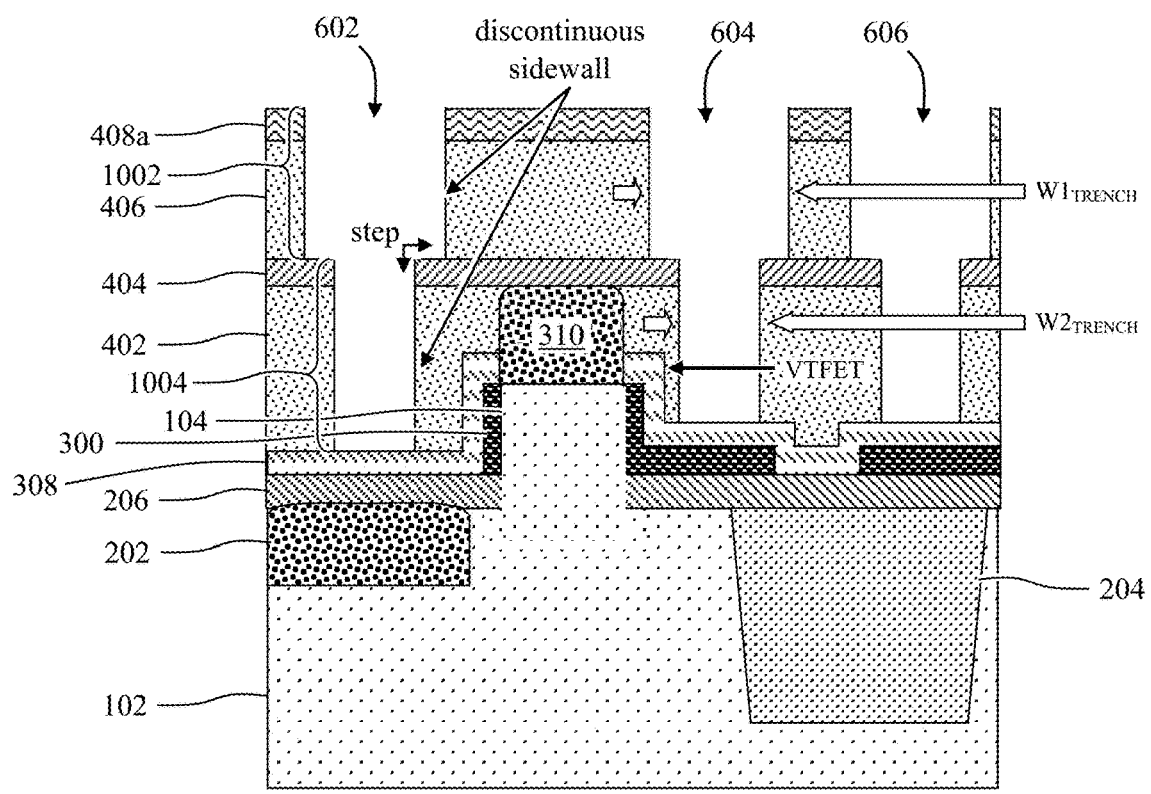
FIG. 10 is an A-A' cross-sectional view illustrating the sidewall spacers having been selectively removed from the first/second contact trenches according to an embodiment of the present invention.
Figure 11:
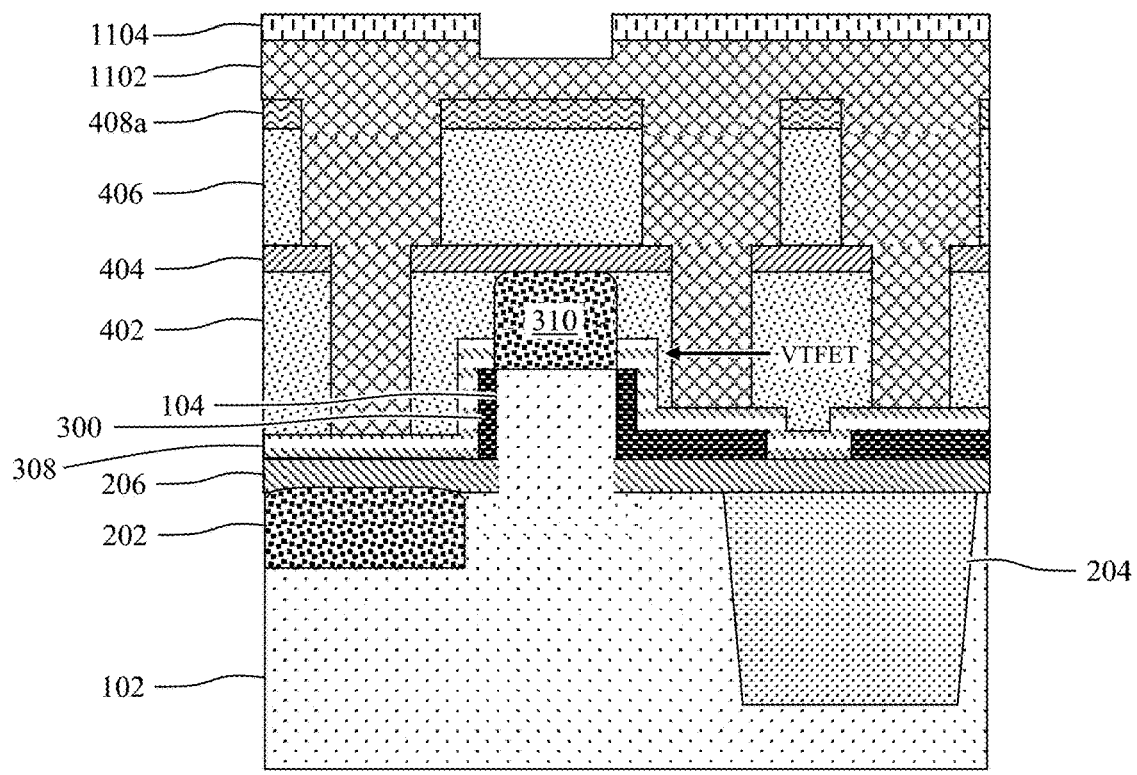
FIG. 11 is an A-A' cross-sectional view illustrating a sacrificial material having been deposited into, and filling the first/second contact trenches, a hardmask layer having been deposited onto the sacrificial material, and the hardmask layer having been patterned with the footprint and location of a (third) contact trench according to an embodiment of the present invention.
Figure 12:
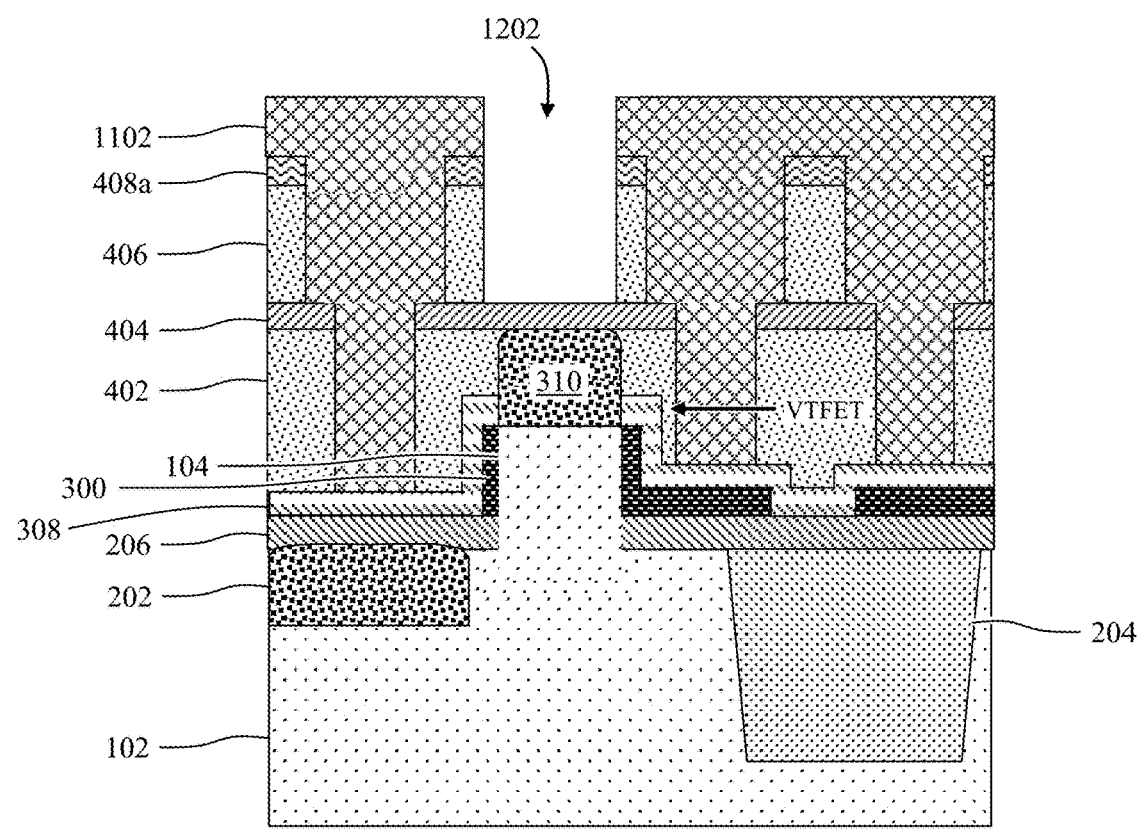
FIG. 12 is an A-A' cross-sectional view illustrating the pattern having been transferred to the sacrificial material, hardmask layer and second ILD to form the third contact trench in the second ILD over the top source/drain region according to an embodiment of the present invention.

The sidewall spacers 702a are then selectively removed from the contact trenches 602, 604 and 606. See FIG. 10 (an A-A' cross-sectional view). A metal-selective wet or dry etching process can be employed to remove the sidewall spacers. As shown in FIG. 10, the present process results in the contact trenches 602, 604 and 606 having a unique shape. Namely, each of the contact trenches 602, 604 and 606 has a top portion 1002 with a width $W1_{TRENCH}$ in the hardmask layer 408a/ILD 406 over a bottom portion 1004 with a width $W2_{TRENCH}$ in the capping layer 404/ILD 402, whereby $W2_{TRENCH}$ is less than $W1_{TRENCH}$, i.e., $W2_{TRENCH} < W1_{TRENCH}$. This configuration results in each of the contact trenches 602, 604 and 606 having a discontinuous sidewall. Namely, the sidewall along the top portion 1002 of the contact trenches 602, 604 and 606 is discontinuous with the sidewall along the bottom portion 1004 of the contact trenches 602, 604 and 606. To look at it another way, a straight, vertical or sloped sidewall from the bottom to the top of a contact trench would be considered continuous. Here, however, a step joins the sidewall along the top portion 1002 of the contact trenches 602, 604 and 606 with the sidewall along the bottom portion 1004 of the contact trenches 602, 604 and 606.

A top source/drain contact trench will also be formed to the top source/drain region 310. In the instant example, a discrete top source/drain contact trench will be formed in between contact trenches 602 and 604. However, an example will also be provided below where the contact trenches over the bottom source/drain region 202 and the top source/drain region 310 are merged.

A sacrificial material 1102 is next deposited into, and filling the contact trenches 602, 604 and 606. See FIG. 11 (an A-A' cross-sectional view). The term 'sacrificial' as used herein refers to a structure that is removed, in whole or in part, during fabrication of the VTFET device. Suitable sacrificial materials 1102 include, but are not limited to, organic planarizing layer (OPL) materials which can be deposited using a casting process such as spin-coating or spray casting. Placing the sacrificial material 1102 into the contact trenches 602, 604 and 606 will enable patterning of a top source/drain contact trench without having an effect on the (already-formed) contact trenches 602, 604 and 606.

Namely, a hardmask layer 1104 is next deposited onto the sacrificial material 1102. Suitable materials for the hardmask layer 1104 include, but are not limited to, nitride materials such as SiN, SiON and/or SiCN, which can be deposited using a process such as CVD, ALD or PVD. According to an exemplary embodiment, the hardmask layer 1104 has a thickness of from about 2 nm to about 10 nm and ranges therebetween. Standard lithography and etching techniques (see above) are then used to pattern the hardmask layer 1104 with the footprint and location of a (top source/drain) contact trench. A directional (i.e., anisotropic) etching process such as RIE can be employed for the hardmask etch. Depending on the selectivity of the etching process employed, some overetch into the sacrificial material 1102 may be expected.

The pattern from the hardmask layer 1104 is then transferred to the sacrificial material 1102, hardmask layer 408a and ILD 406, forming a contact trench 1202 in the ILD 406 over the top source/drain region 310. See FIG. 12 (an A-A' cross-sectional view). For clarity, the term 'third' may also be used herein when referring to contact trench 1202 in order to distinguish it from 'first' contact trench 602 and 'second' contact trenches 604/606. A directional (i.e., anisotropic) etching process such as RIE can be employed for the contact trench etch. As provided above, the hardmask layer 408a can be formed from a nitride material (e.g., SiN), a metal oxide and/or a metal nitride material (e.g., HfOx, AlOx and/or AlN) and the ILD 406 can be formed from an oxide material (e.g., SiOx and/or SiCOH). In that case, a series of RIE steps may be used such as a metal-selective RIE step to pattern the hardmask layer 408a, followed by an oxide-selective RIE step to pattern the ILD 406. The capping layer 404, which can be formed from a nitride material (e.g., SiN, SiON and/or SiCN—see above), will act as an etch stop during patterning of the ILD 406. The etch used to pattern the hardmask layer 408a and ILD 406 will also remove the hardmask layer 1104.

Figure 13:
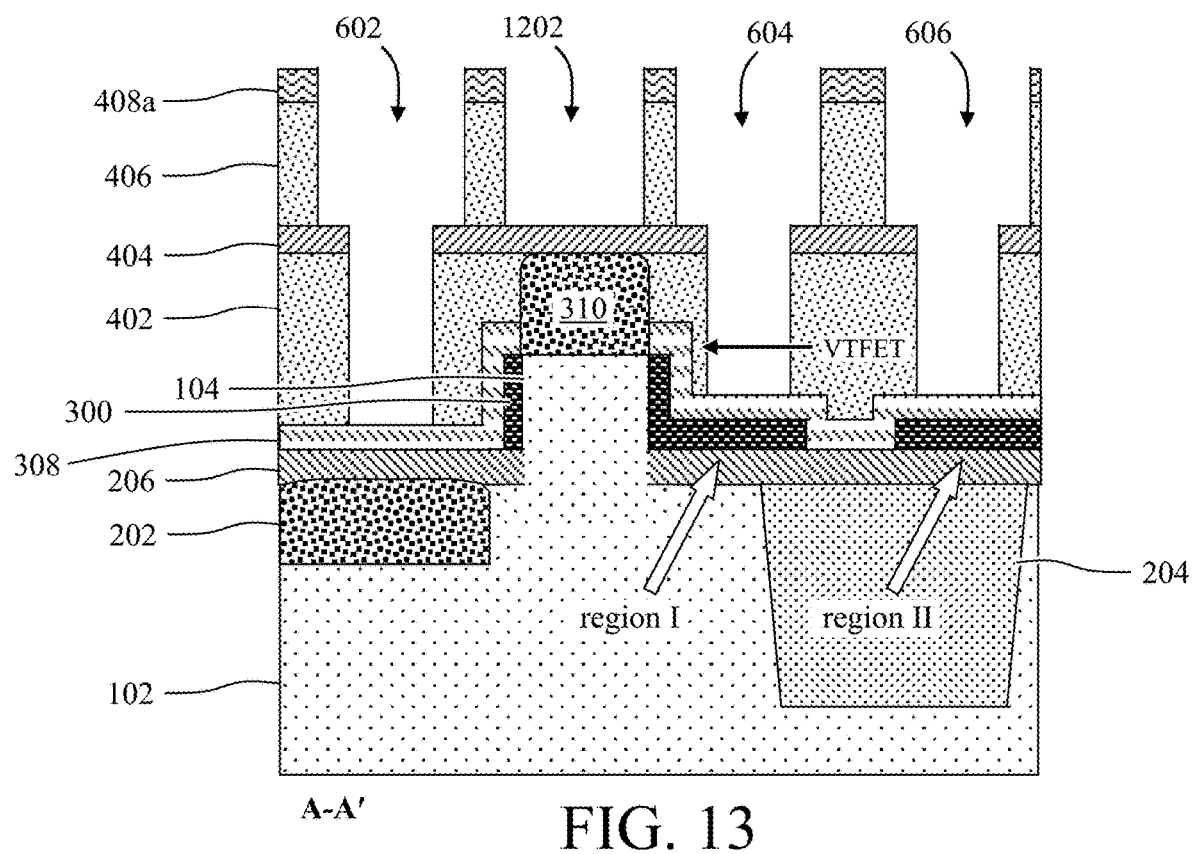
FIG. 13 is an A-A' cross-sectional view illustrating the sacrificial material having been selectively removed, re-opening the first/second contact trenches according to an embodiment of the present invention.

Following patterning of the contact trench 1202, the sacrificial material 1102 is then selectively removed, re-opening the contact trenches 602, 604 and 606. See FIG. 13 (an A-A' cross-sectional view). As provided above, the sacrificial material 1102 can be an OPL material. In that case, a process such as ashing can be employed to selectively remove the sacrificial material 1102. As shown in FIG. 13, contact trenches 602, 604 and 606 (each having a reduced bottom width—see above) have been formed over the bottom source/drain region 202 and over the first/second region I/region II of the gate stack 300, respectively, and contact trench 1202 has been formed over the top source/drain region 310.

Figure 14:
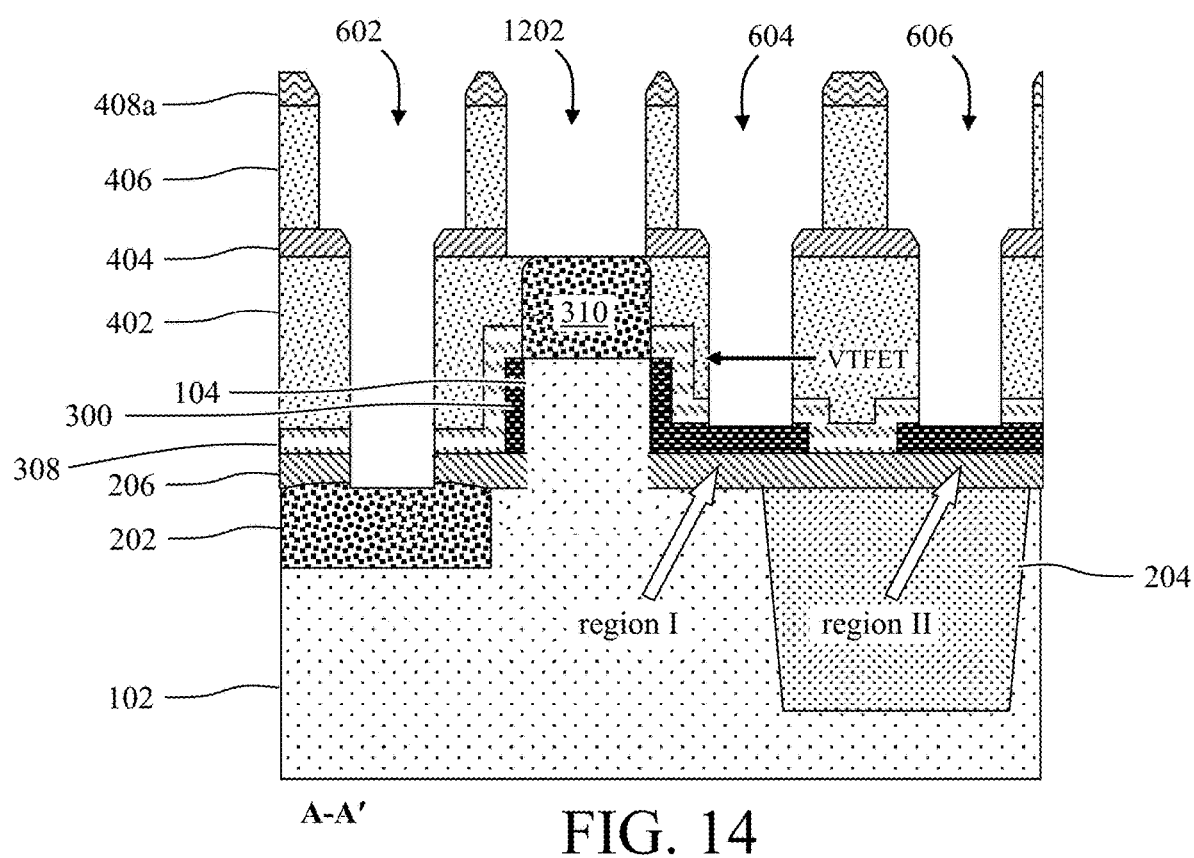
FIG. 14 is an A-A' cross-sectional view illustrating an etch having been performed to extend the first/second/third contact trenches through the encapsulation layer and the capping layer according to an embodiment of the present invention.

As shown in FIG. 13, the encapsulation layer 308 still remains separating contact trenches 602, 604 and 606 from the bottom source/drain region 202 and the first/second region I/region II of the gate stack 300, and the capping layer 404 still remains separating contact trench 1202 from the top source/drain region 310. However, an etch is next performed to extend the contact trenches 602/604/606 and 1202 through the encapsulation layer 308 and the capping layer 404. See FIG. 14 (an A-A' cross-sectional view). As provided above, nitride materials can be employed for both the encapsulation layer 308 (e.g., SiN, SiBN, SiBCN and/or SiOCN) and the capping layer 404 (e.g., SiN, SiON and/or SiCN). In that case, a nitride-selective etch such as a nitride-selective RIE can be employed to extend the contact trenches 602/604/606 and 1202 through the encapsulation layer 308 and the capping layer 404. As shown in FIG. 14, the bottom source/drain region 202, the first/second region I/region II of the gate stack 300, and the top source/drain region 310 are all now exposed at the bottoms of the contact trenches 602/604/606 and 1202, respectively. As shown in FIG. 13, some erosion and faceting of the hardmask layer 408a and capping layer 404 can occur during the opening of the encapsulation layer 308.

Figure 15:
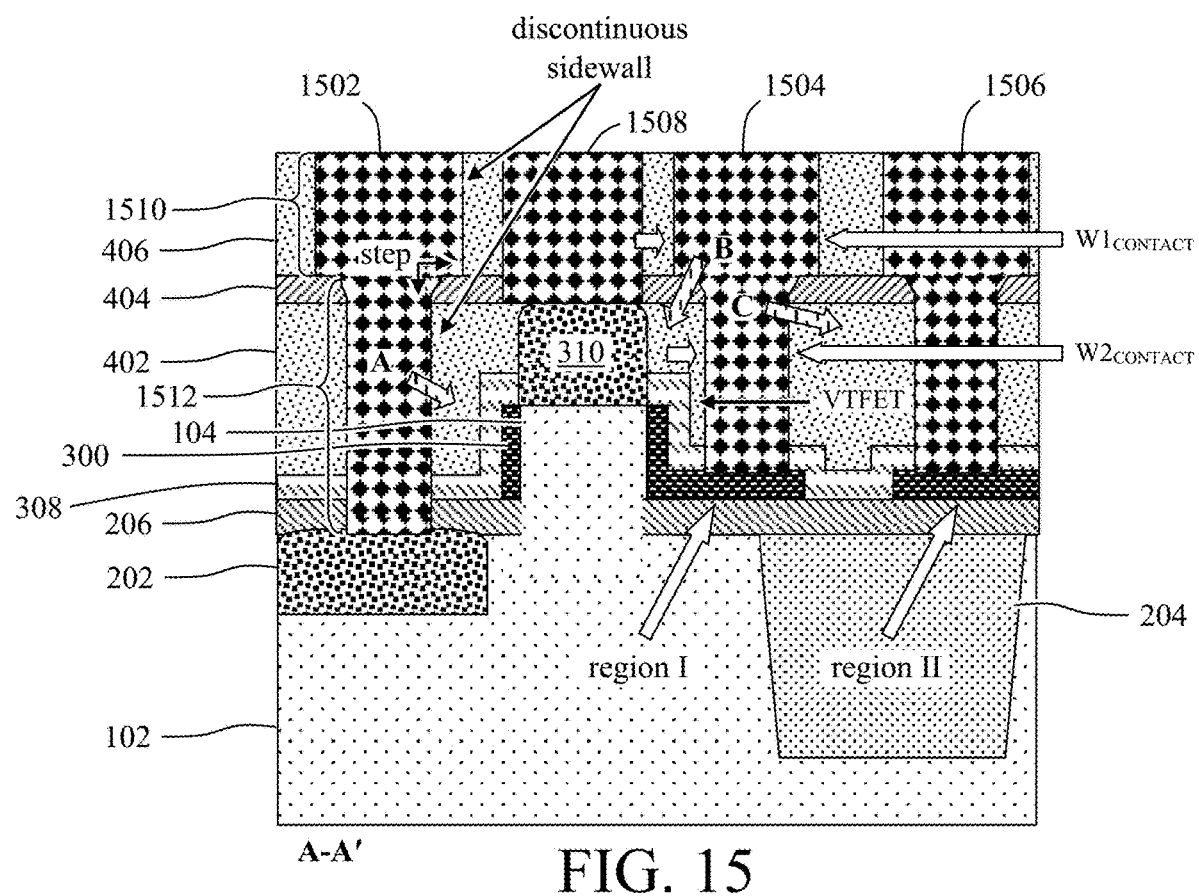
FIG. 15 is an A-A' cross-sectional view illustrating a contact metal(s) having been deposited into, and filling the first/second/third contact trenches to form a bottom source/drain contact, a (first) gate contact, a (second) gate contact and a top source/drain contact according to an embodiment of the present invention.

A contact metal or combination of contact metals is/are then deposited into, and filling the contact trenches 602, 604, 606 and 1202, forming bottom source/drain contact 1502, (first) gate contact 1504, (second) gate contact 1506 and top source/drain contact 1508, respectively. See FIG. 15 (an A-A' cross-sectional view). As shown in FIG. 15, the bottom source/drain contact 1502 is in direct contact with bottom source/drain 202, gate contact 1504 is in direct contact with the region I of the gate stack 300, gate contact 1506 is in direct contact with the region II of the gate stack 300, and top source/drain contact 1508 is in direct contact with the top source/drain region 310. In the present example, the top source/drain contact 1508 is located in between the bottom source/drain contact 1502 and the gate contact 1504. As described above, it is assumed in the present example that region II of the gate stack 300 is associated with an adjacent VTFET device (not shown).

Suitable contact metals include, but are not limited to, copper (Cu), tungsten (W), ruthenium (Ru), cobalt (Co), nickel (Ni) and/or platinum (Pt), which can be deposited into the contact trenches 602, 604, 606 and 1202 using a process such as evaporation, sputtering, or electrochemical plating. Following deposition, the metal overburden can be removed using a process such as CMP (which can also remove the hardmask layer 408a). Prior to depositing the contact metal(s) into the contact trenches 602, 604, 606 and 1202, a conformal barrier layer (not shown) can be deposited into and lining the contact trenches 602, 604, 606 and 1202. Use of such a barrier layer helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the contact trenches 602, 604, 606 and 1202 prior to contact metal deposition. A seed layer facilitates plating of the contact metal into the contact trenches 602, 604, 606 and 1202.

As shown in FIG. 15, the present process results in at least the bottom source/drain contact 1502 and gate contacts 1504 and 1506 having a unique shape. Namely, each of the bottom source/drain contact 1502 and gate contacts 1504 and 1506 has a top portion 1510 with a width $W1_{CONTACT}$ in the ILD 406 over a bottom portion 1512 with a width $W2_{CONTACT}$ in the ILD 402/encapsulation layer 308 (and the bottom spacer 206 in the case of the bottom source/drain contact 1502), whereby $W2_{CONTACT}$ is less than $W1_{CONTACT}$, i.e., $W2_{CONTACT} < W1_{CONTACT}$. This configuration results in each of the bottom source/drain contact 1502 and gate contacts 1504 and 1506 having a discontinuous sidewall. Namely, the sidewall along the top portion 1510 of the bottom source/drain contact 1502 and gate contacts 1504 and 1506 is discontinuous with the sidewall along the bottom portion 1512 of the bottom source/drain contact 1502 and gate contacts 1504 and 1506. To look at it another way, a straight, vertical or sloped sidewall from the bottom to the top of a contact would be considered continuous. Here, however, a step joins the sidewall along the top portion 1510 of the bottom source/drain contact 1502 and gate contacts 1504 and 1506 with the sidewall along the bottom portion 1512 of the bottom source/drain contact 1502 and gate contacts 1504 and 1506. Notably, the narrower bottom portion 1512 (with width $W2_{CONTACT}$) of the bottom source/drain contact 1502 and gate contacts 1504 and 1506 is present alongside the gate stack 300 and the top source/drain region 310, while the wider top portion 1510 (with width $W1_{CONTACT}$) is present entirely above the top source/drain region 310. Advantageously, by employing a reduced/narrower width (i.e., $W2_{CONTACT}$) for the bottom portion 1512 of the bottom source/drain contact 1502 and gate contacts 1504 and 1506, a significant amount of the ILD 402 remains separating the bottom source/drain contact 1502 from the gate stack 300 (see, e.g., arrow A), separating the gate contact 1504 from the top source/drain region 310 (see, e.g., arrow B), and separating the gate contact 1504 from the gate contact 1506 of an adjacent VTFET (not shown) (see, e.g., arrow C). By way of example only, according to one exemplary, non-limiting example, $W1_{CONTACT}$ is from about 5 nm to about 15 nm and ranges therebetween, and $W2_{CONTACT}$ is from about 3 nm to about 10 nm and ranges therebetween.

Figure 16:
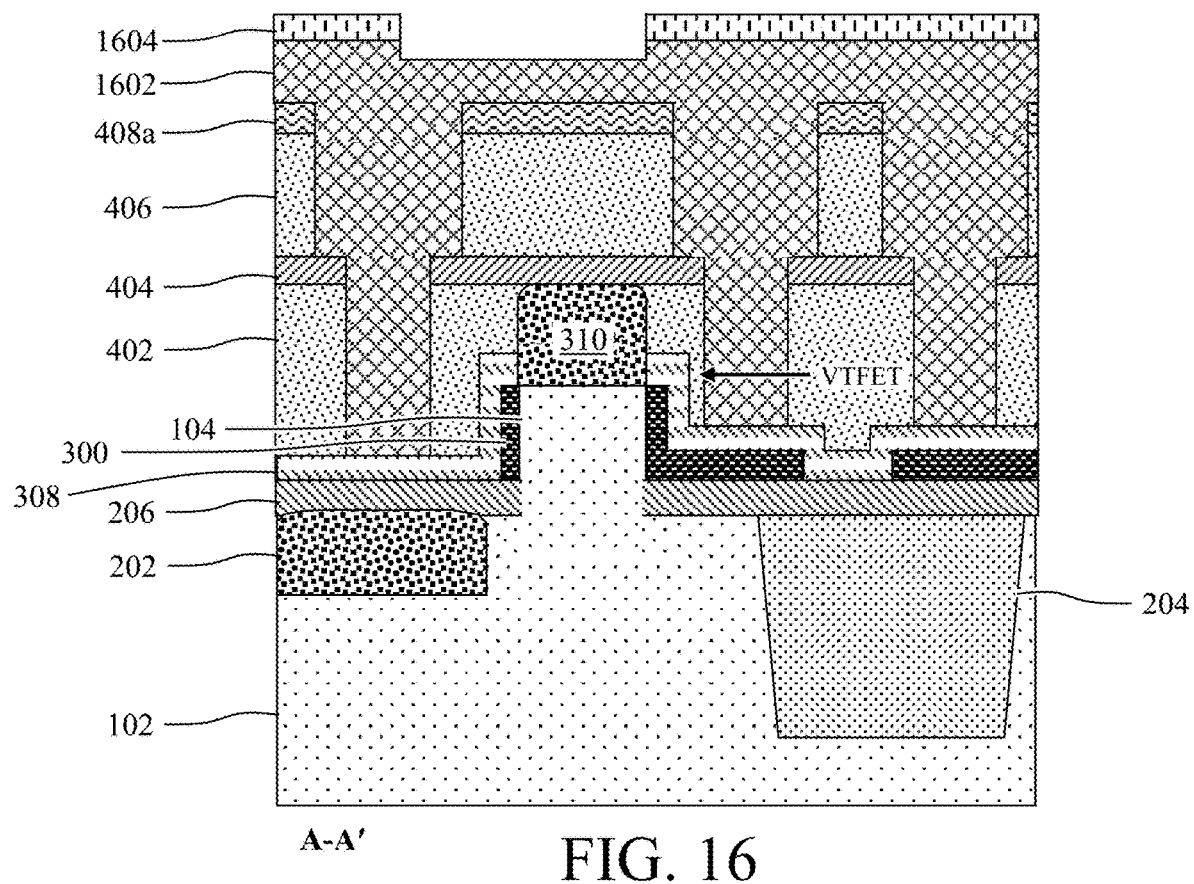
FIG. 16 is an A-A' cross-sectional view, which follows from FIG. 10, illustrating according to an alternative embodiment a sacrificial material having been deposited into, and filling the first/second contact trenches, and a hardmask layer having been deposited onto the sacrificial material and patterned according to an embodiment of the present invention.
Figure 17:
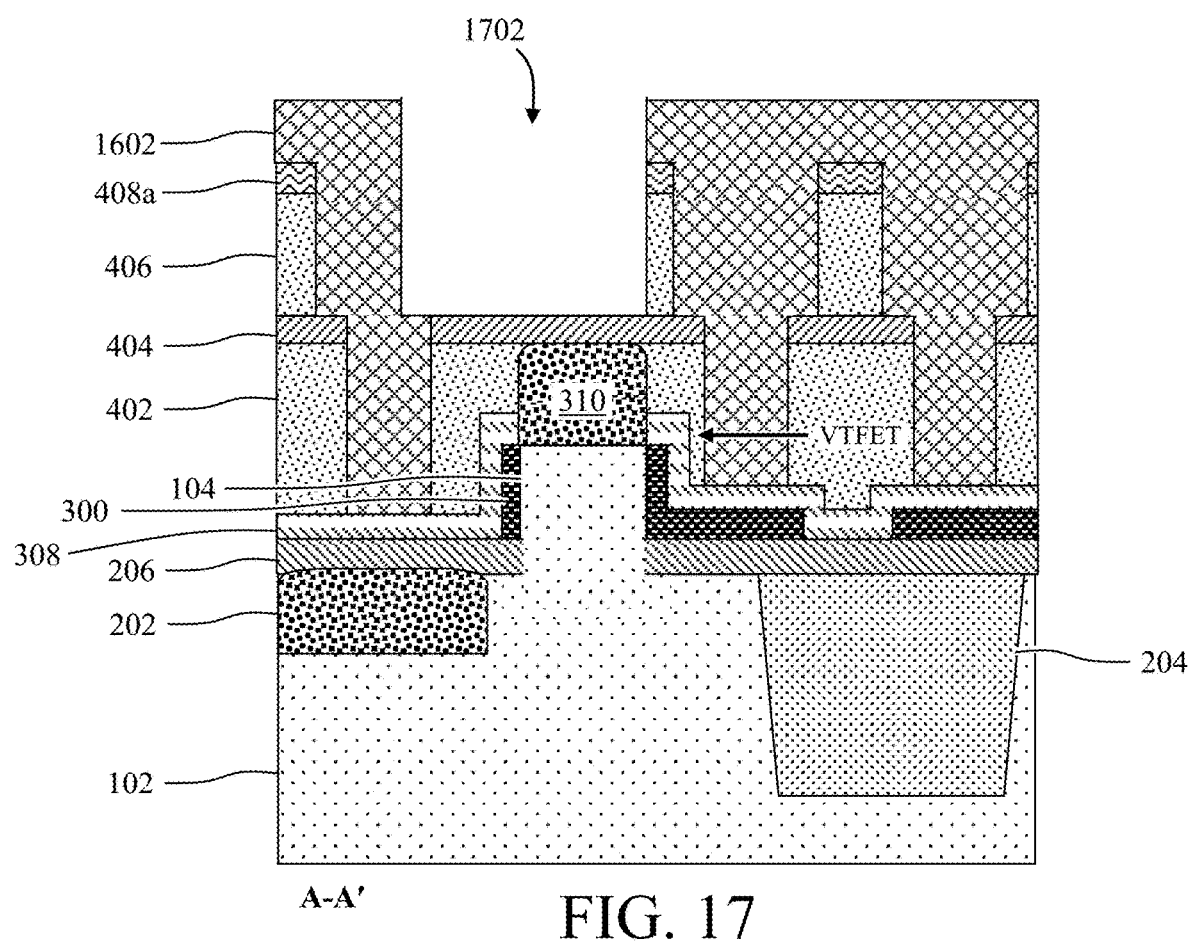
FIG. 17 is an A-A' cross-sectional view illustrating the pattern having been transferred to the sacrificial material, hardmask layer and second ILD to form a (third) contact trench in the second ILD over the top source/drain region according to an embodiment of the present invention.

As provided above, designs are also contemplated herein where the contact trenches over the bottom source/drain region 202 and the top source/drain region 310 overlap one another and thus are merged, forming a power rail. Such a configuration is advantageous in situations where device density scaling or power consumption reduction are required. This alternative embodiment is now described by way of reference to FIGS. 16-20. The process begins in exactly the same manner as described in conjunction with the description of FIGS. 1-10 above, i.e., with the formation of a VTFET(s) having a fin(s) 104 (a vertical fin channel) disposed on the substrate 102, bottom source/drain region 202 and STI region 204 in the substrate 102, gate stack 300 alongside the fin(s) 104, and a top source/drain region 310 present at a top of the fin(s) 104, the formation of bottom spacer 206 and encapsulation layer 308 over the bottom source/drain region 202 and STI region 204, formation of the ILD 402/capping layer 404/ILD 406/hardmask layer 408a stack over the VTFET(s), partial patterning of the contact trenches 602/604/606 in the ILD 406, formation of sidewall spacers 702a along the sidewall of the contact trenches 602/604/606 to reduce their width in the ILD 406, extension of the contact trenches 602/604/606 through the capping layer 404 and ILD 402, and removal of the sidewall spacers 702a. Thus, what is depicted in FIG. 16 follows from the structure shown illustrated in FIG. 10. Like structures are numbered alike in the figures.

As shown in FIG. 16 (an A-A' cross-sectional view), in the same manner as described above, a sacrificial material 1602 is next deposited into, and filling the contact trenches 602, 604 and 606. Suitable sacrificial materials 1602 include, but are not limited to, OPL materials which can be deposited using a casting process such as spin-coating or spray casting. As described above, the sacrificial material 1602 protects the (already-formed) contact trenches 602, 604 and 606 during patterning of a top source/drain contact trench.

Namely, a hardmask layer 1604 is next deposited onto the sacrificial material 1602. Suitable materials for the hardmask layer 1604 include, but are not limited to, nitride materials such as SiN, SiON and/or SiCN, which can be deposited using a process such as CVD, ALD or PVD. According to an exemplary embodiment, the hardmask layer 1604 has a thickness of from about 2 nm to about 10 nm and ranges therebetween. Standard lithography and etching techniques (see above) are then used to pattern the hardmask layer 1604 with the footprint and location of a (top source/drain) contact trench. A directional (i.e., anisotropic) etching process such as RIE can be employed for the hardmask etch. Depending on the selectivity of the etching process employed, some overetch into the sacrificial material 1602 may be expected. Comparing FIG. 16 with the previous example depicted in FIG. 11 and described above, it can be seen that the pattern in hardmask layer 1604 for the top source/drain contact trench actually extends over the contact trench 602 (presently filled with the sacrificial material 1602)/bottom source/drain region 202. By comparison, in FIG. 11, the pattern in hardmask layer 1104 for the top source/drain contact trench of the previous example is centered over the top source/drain region 310.

The pattern from the hardmask layer 1604 is then transferred to the sacrificial material 1602, hardmask layer 408a and ILD 406, forming a contact trench 1702 in the ILD 406 over the top source/drain region 310. See FIG. 17 (an A-A' cross-sectional view). For clarity, the term 'third' may also be used herein when referring to contact trench 1702 in order to distinguish it from 'first' contact trench 602 and 'second' contact trenches 604/606. A directional (i.e., anisotropic) etching process such as RIE can be employed for the contact trench etch. As provided above, the hardmask layer 408a can be formed from a nitride material (e.g., SiN), a metal oxide and/or a metal nitride material (e.g., HfOx, AlOx and/or AlN) and the ILD 406 can be formed from an oxide material (e.g., SiOx and/or SiCOH). In that case, a series of RIE steps may be used such as a metal-selective RIE step to pattern the hardmask layer 408a, followed by an oxide-selective RIE step to pattern the ILD 406. The capping layer 404, which can be formed from a nitride material (e.g., SiN, SiON and/or SiCN—see above), will act as an etch stop during patterning of the ILD 406. The etch used to pattern the hardmask layer 408a and ILD 406 will also remove the hardmask layer 1604.

Figure 18:
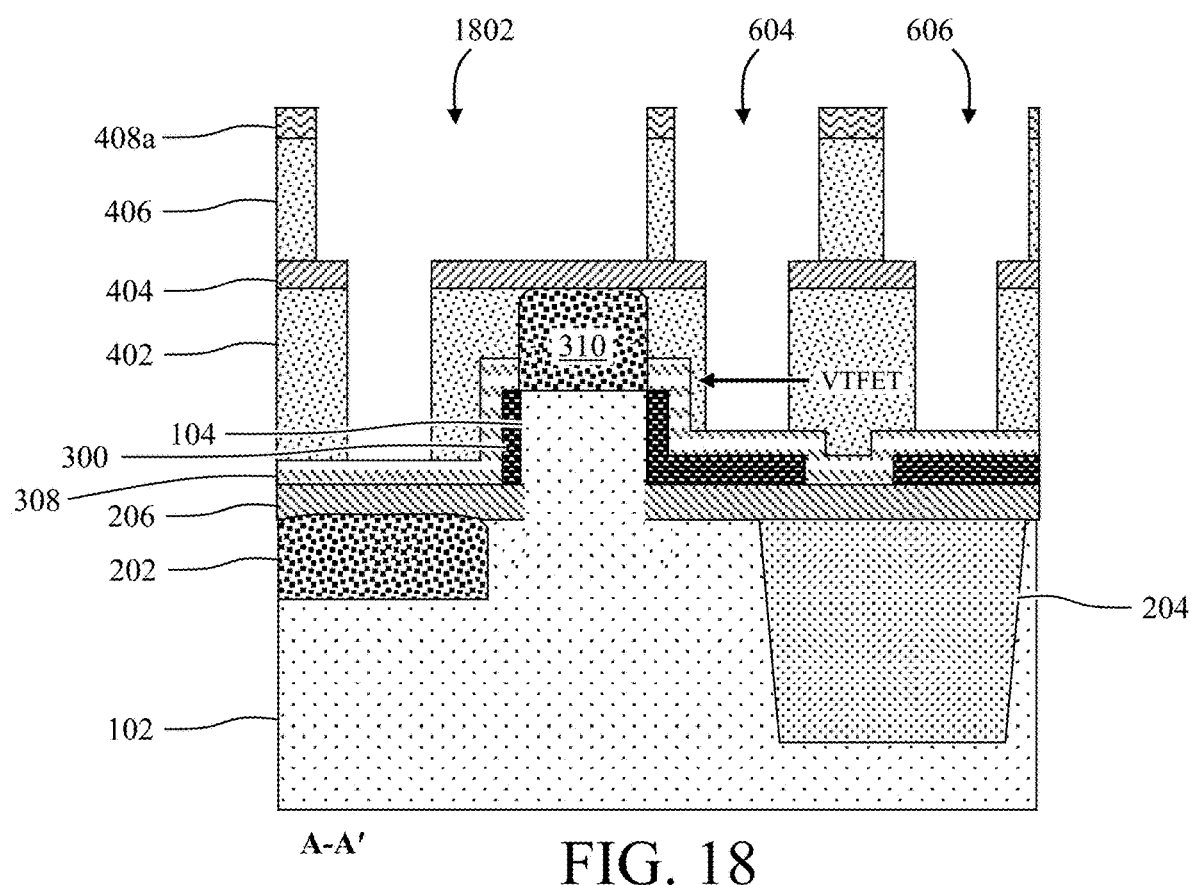
FIG. 18 is an A-A' cross-sectional view illustrating the sacrificial material having been selectively removed, re-opening the first/second contact trenches to reveal that the first contact trench and the third contact trench overlap to form a merged contact trench over both the bottom source/drain region and the top source/drain region according to an embodiment of the present invention.

Following patterning of the contact trench 1702, the sacrificial material 1602 is then selectively removed, re-opening the contact trenches 602, 604 and 606. See FIG. 18 (an A-A' cross-sectional view). As provided above, the sacrificial material 1602 can be an OPL material. In that case, a process such as ashing can be employed to selectively remove the sacrificial material 1602. Based on the footprint and location of the contact trench 1702, contact trench 602 and contact trench 1702 overlap forming a merged contact trench 1802 over both the bottom source/drain region 202 and the top source/drain region 310. See FIG. 18. As shown in FIG. 18, contact trenches 604 and 606 (each having a reduced bottom width—see above) have been formed over the first/second region I/region II of the gate stack 300, respectively, and a common (merged) contact trench 1802 has been formed over the bottom source/drain region 202 and the top source/drain region 310.

Figure 19:
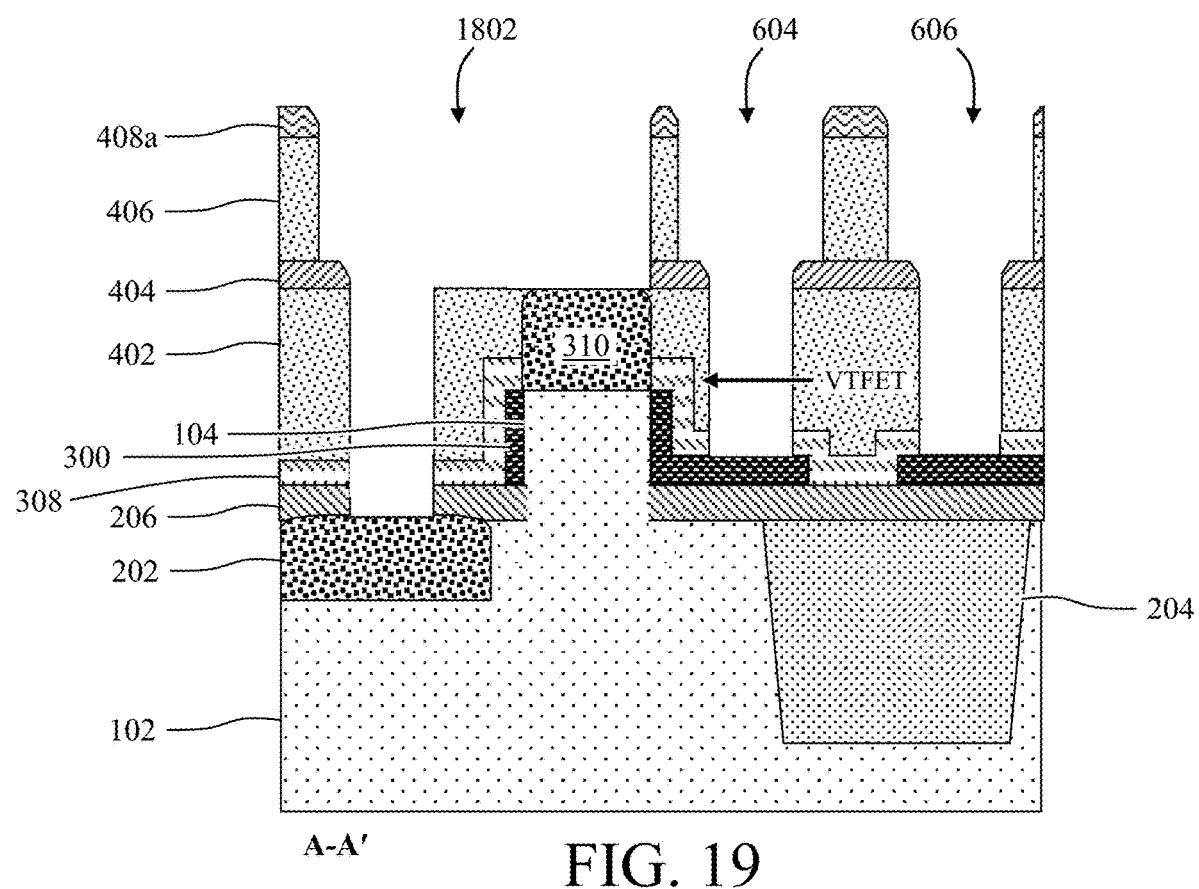
FIG. 19 is an A-A' cross-sectional view illustrating an etch having been performed to extend the first/second contact trenches and the merged contact trench through the encapsulation layer and the capping layer according to an embodiment of the present invention.

As shown in FIG. 18, the encapsulation layer 308 still remains separating contact trenches 602 and 604 from the first/second region I/region II of the gate stack 300, and the encapsulation layer 308 and capping layer 404 still remains separating merged contact trench 1802 from the bottom source/drain region 202 and the top source/drain region 310, respectively. However, an etch is next performed to extend the contact trenches 604/606 and merged contact trench 1802 through the encapsulation layer 308 and the capping layer 404. See FIG. 19 (an A-A' cross-sectional view). As provided above, nitride materials can be employed for both the encapsulation layer 308 (e.g., SiN, SiBN, SiBCN and/or SiOCN) and the capping layer 404 (e.g., SiN, SiON and/or SiCN). In that case, a nitride-selective etch such as a nitride-selective RIE can be employed to extend the contact trenches 604/606 and merged contact trench 1802 through the encapsulation layer 308 and the capping layer 404. As shown in FIG. 19, the first/second region I/region II of the gate stack 300, and the bottom source/drain region 202/top source/drain region 310 are all now exposed at the bottoms of the contact trenches 604/606 and merged contact trench 1802, respectively. As shown in FIG. 19, some erosion and faceting of the hardmask layer 408a and capping layer 404 can occur during the opening of the encapsulation layer 308.

Figure 20:
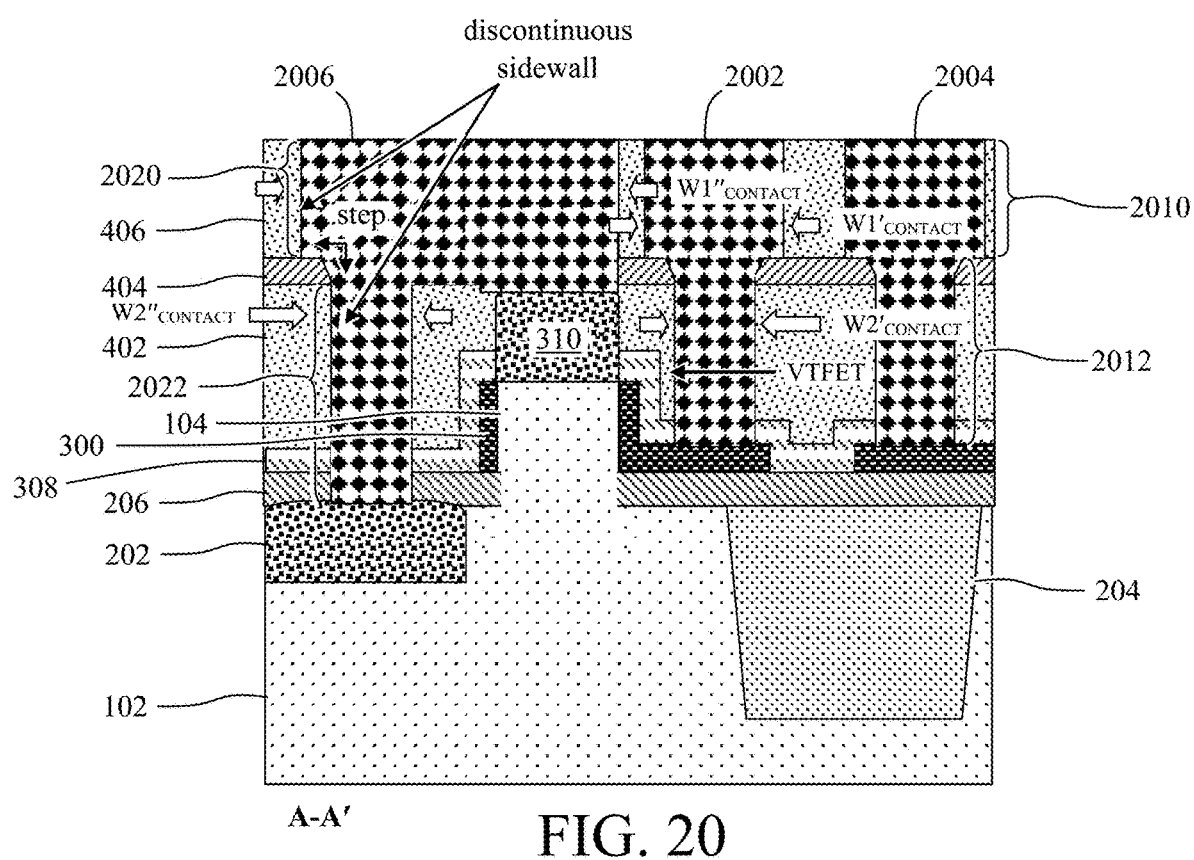
FIG. 20 is an A-A' cross-sectional view illustrating a contact metal(s) having been deposited into, and filling the first/second contact trenches and merged contact trench to form a (first) gate contact, a (second) gate contact and a (merged) top and bottom source/drain contact according to an embodiment of the present invention.

A contact metal or combination of contact metals is/are then deposited into, and filling the contact trenches 604/606 and merged contact trench 1802, forming (first) gate contact 2002, (second) gate contact 2004 and (merged) top and bottom source/drain contact 2006, respectively. See FIG. 20 (an A-A' cross-sectional view). As shown in FIG. 20, gate contact 2002 is in direct contact with the region I of the gate stack 300, gate contact 2004 is in direct contact with the region II of the gate stack 300, and top and bottom source/drain contact 2006 is in direct contact with both the bottom source/drain region 202 and the top source/drain region 310. As described above, it is assumed in the present example that region II of the gate stack 300 is associated with an adjacent VTFET device (not shown).

As provided above, suitable contact metals include, but are not limited to, Cu, W, Ru, Co, Ni and/or Pt, which can be deposited into the contact trenches 604, 606 and merged contact trench 1802 using a process such as evaporation, sputtering, or electrochemical plating. Following deposition, the metal overburden can be removed using a process such as CMP (which can also remove the hardmask layer 408a). Prior to depositing the contact metal(s) into the contact trenches 604, 606 and merged contact trench 1802, a conformal barrier layer (not shown) can be deposited into and lining the contact trenches 604, 606 and merged contact trench 1802. Use of such a barrier layer helps to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the contact trenches 604, 606 and merged contact trench 1802 prior to contact metal deposition. A seed layer facilitates plating of the contact metal into the contact trenches 604, 606 and 1802.

As shown in FIG. 20, the present process results in at least the gate contacts 2002 and 2004 and the top and bottom source/drain contact 2006 having a unique shape. Namely, each of the gate contacts 2002 and 2004 has a top portion 2010 with a width $W1'_{CONTACT}$ in the ILD 406 over a bottom portion 2012 with a width $W2'_{CONTACT}$ in the ILD 402/encapsulation layer 308, whereby $W2'_{CONTACT}$ is less than $W1'_{CONTACT}$, i.e., $W2'_{CONTACT} < W1'_{CONTACT}$. Top and bottom source/drain contact 2006 has a top portion 2020 with a width $W1''_{CONTACT}$ in the ILD 406 over a bottom portion 2022 with a width $W2''_{CONTACT}$ in the ILD 402/encapsulation layer 308 (and the bottom spacer 206 over the bottom source/drain region 202), whereby $W2''_{CONTACT}$ is less than W1"CONTACT, i.e., $W2''_{CONTACT} < W1''_{CONTACT}$. Further, as compared to the previous example, because contact trench 602 and contact trench 1702 have been merged into the common contact trench 1802, $W1''_{CONTACT}$ is greater than $W1'_{CONTACT}$, i.e., $W1''_{CONTACT} > W1'_{CONTACT}$.

This configuration results in each of the gate contacts 1504/1506 and the top and bottom source/drain contact 2006 having a discontinuous sidewall. Namely, the sidewall along the top portion 2010/2020 of the gate contacts 1504 and 1506/top and bottom source/drain contact 2006 is discontinuous with the sidewall along the bottom portion 2012/2022 of the gate contacts 1504 and 1506/top and bottom source/drain contact 2006. To look at it another way, a straight, vertical or sloped sidewall from the bottom to the top of a contact would be considered continuous. Here, however, a step joins the sidewall along the top portion 2010/2020 of the gate contacts 1504 and 1506/top and bottom source/drain contact 2006 with the sidewall along the bottom portion 2012/2022 of the gate contacts 1504 and 1506/top and bottom source/drain contact 2006. Notably, the narrower bottom portion 2012/2022 (with width $W2'_{CONTACT}/W2''_{CONTACT}$) of the gate contacts 1504 and 1506/top and bottom source/drain contact 2006 is present alongside the gate stack 300 and the top source/drain region 310, while the wider top portion 2010/2020 (with width $W1'_{CONTACT}/W1''_{CONTACT}$) is present entirely above the top source/drain region 310. By way of example only, according to one exemplary, non-limiting example, $W1'_{CONTACT}$ is from about 5 nm to about 15 nm and ranges therebetween, $W1''_{CONTACT}$ is from about 10 nm to about 20 nm and ranges therebetween, $W2'_{CONTACT}$ is from about 3 nm to about 10 nm and ranges therebetween, and $W2''_{CONTACT}$ is from about 3 nm to about 10 nm and ranges therebetween.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical transport field effect transistor (VTFET) device, comprising:
   at least one fin serving as a vertical fin channel;
   a bottom source/drain region present at a base of the at least one fin;
   a gate stack alongside the at least one fin, wherein the gate stack extends along a vertical sidewall of the at least one fin;
   a top source/drain region present at a top of the at least one fin;
   an encapsulation layer located on top of and along a vertical side of the gate stack that extends along a vertical sidewall of the at least one fin, wherein the encapsulation layer is located adjacent to the top source/drain region;
   a bottom spacer located adjacent to the sidewalls of the at least one fin, wherein the gate stack is in contact with a top surface of the bottom spacer, wherein the encapsulation layer is in contact with the top surface of the bottom spacer;
   a bottom source/drain contact to the bottom source/drain region; and
   a gate contact to the gate stack, wherein the bottom source drain contact and the gate contact each comprises a single solid structure with a top portion having a width $W1_{CONTACT}$ over a bottom portion having a width $W2_{CONTACT}$, wherein $W2_{CONTACT} < W1_{CONTACT}$, and wherein a sidewall along the top portion is discontinuous with a sidewall along the bottom portion.

2. The VTFET device of claim 1, wherein a step joins the sidewall along the top portion with the sidewall along the bottom portion.

3. The VTFET device of claim 1,
   wherein the bottom spacer is located over the bottom source/drain region.

4. The VTFET device of claim 3, wherein the encapsulation layer comprises a material selected from the group consisting of: silicon nitride (SiN), silicon-boron-nitride (SiBN), siliconborocarbonitride (SiBCN), silicon oxycarbonitride (SiOCN), and combinations thereof.

5. The VTFET device of claim 3, wherein portions of the encapsulation layer at the tops of the at least one fin serve as a top spacer.

6. The VTFET device of claim 3, further comprising:
   a first interlayer dielectric (ILD) over the encapsulation layer;
   a capping layer disposed on the first ILD; and
   a second ILD disposed on the capping layer.

7. The VTFET device of claim 6, wherein the capping layer comprises a material selected from the group consisting of: SiN, silicon oxynitride (SiON), silicon carbide nitride (SiCN), and combinations thereof.

8. The VTFET device of claim 6, wherein the bottom portion of the bottom source drain contact having the width $W2_{CONTACT}$ is present in the bottom spacer, the encapsulation layer, and the first ILD, and wherein the top portion of the bottom source drain contact having the width $W1_{CONTACT}$ is present in the second ILD.

9. The VTFET device of claim 6, wherein the bottom portion of the gate contact having the width $W2_{CONTACT}$ is present in the encapsulation layer, and the first ILD, and wherein the top portion of the gate contact having the width $W1_{CONTACT}$ is present in the second ILD.

10. The VTFET device of claim 1, wherein $W1_{CONTACT}$ is from about 5 nm to about 15 nm, and wherein $W2_{CONTACT}$ is from about 3 nm to about 10 nm.

11. The VTFET device of claim 1, further comprising:
    a top source/drain contact to the top source/drain region located in between the bottom source/drain contact and the gate contact.

12. The VTFET device of claim 11, wherein the top source/drain contact overlaps at least a portion of the bottom source/drain contact.

13. A vertical transport field effect transistor (VTFET) device, comprising:
    at least one fin serving as a vertical fin channel of the VTEFT device;
    a bottom source/drain region present at a base of the at least one fin;
    a gate stack alongside the at least one fin, wherein the gate stack extends along a vertical sidewall of the at least one fin;
    a top source/drain region present at a top of the at least one fin;
    an encapsulation layer located on top of and along a vertical side of the gate stack that extends along a vertical sidewall of the at least one fin, wherein the encapsulation layer is located adjacent to the top source/drain region;
    a bottom spacer located adjacent to the sidewalls of the at least one fin, wherein the gate stack is in contact with a top surface of the bottom spacer, wherein the encapsulation layer is in contact with the top surface of the bottom spacer;
    a bottom source/drain contact to the bottom source/drain region; and
    a gate contact to the gate stack, wherein the bottom source drain contact and the gate contact each comprises a single solid structure with a top portion having a width $W1_{CONTACT}$ over a bottom portion having a width $W2_{CONTACT}$, wherein $W2_{CONTACT} < W1_{CONTACT}$, and wherein the bottom portion having the width $W2_{CONTACT}$ is present alongside the gate stack and the top source/drain region.

14. The VTFET device of claim 13, wherein the top portion having a width $W1_{CONTACT}$ is present above the top source/drain region.

15. The VTFET device of claim 13, wherein a sidewall along the top portion is discontinuous with a sidewall along the bottom portion.

16. The VTFET device of claim 15, wherein a step joins the sidewall along the top portion with the sidewall along the bottom portion.

17. The VTFET device of claim 13, further comprising:
a top source/drain contact to the top source/drain region located in between the bottom source/drain contact and the gate contact.

18. The VTFET device of claim 17, wherein the top source/drain contact overlaps at least a portion of the bottom source/drain contact.

19. A method of forming a vertical transport field effect transistor (VTFET) device, the method comprising:
forming a VTFET comprising: at least one fin serving as a vertical fin channel, a bottom source/drain region present at a base of the at least one fin, a bottom spacer is located over the bottom source/drain region, a gate stack alongside the at least one fin, an encapsulation layer disposed over the gate stack, and a top source/drain region present at a top of the at least one fin, wherein the gate stack extends along a vertical sidewall of the at least one fin, wherein the encapsulation layer in in contact with a sidewall of the top source/drain region and a vertical sidewall of the gate stack, wherein the bottom spacer is located adjacent to the sidewalls of the at least one fin, wherein the gate stack is in contact with a top surface of the bottom spacer, wherein the encapsulation layer is in contact with the top surface of the bottom spacer;

depositing a first ILD over the VTFET;
depositing a capping layer on the first ILD;
depositing a second ILD on the capping layer;
forming contact trenches in the second ILD, wherein the contact trenches comprise at least a first contact trench over the bottom source/drain region and a second contact trench over the gate stack;
forming sidewall spacers along sidewalls of the contact trenches;
performing an etch between the sidewall spacers to extend the contact trenches through the capping layer and the first ILD;
removing the sidewall spacers such that each of the contact trenches comprises a top portion having a width $W1_{TRENCH}$ over a bottom portion having a width $W2_{TRENCH}$, wherein $W2_{TRENCH} < W1_{TRENCH}$, and wherein a sidewall along the top portion is discontinuous with a sidewall along the bottom portion; and
filling the top portion and the bottom portion of each of the contact trenches with at least one contact metal to form a single solid structure therein.

20. The method of claim 19, further comprising:
forming a third contact trench in the second ILD over the top source/drain region, wherein the third contact trench overlaps the first contact trench to form a merged contact trench over both the bottom source/drain region and the top source/drain region.

\* \* \* \* \*